(12) United States Patent
Xu et al.

(10) Patent No.: US 7,307,118 B2
(45) Date of Patent: Dec. 11, 2007

(54) COMPOSITION TO REDUCE ADHESION BETWEEN A CONFORMABLE REGION AND A MOLD

(75) Inventors: Frank Y. Xu, Round Rock, TX (US); Michael N. Miller, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 144 days.

(21) Appl. No.: 11/068,171

(22) Filed: Feb. 28, 2005

(65) Prior Publication Data

US 2006/0111454 A1 May 25, 2006

Related U.S. Application Data

(60) Division of application No. 11/068,397, filed on Feb. 28, 2005, now abandoned, which is a continuation-in-part of application No. 11/012,375, filed on Dec. 15, 2004, now abandoned, which is a continuation-in-part of application No. 11/012,374, filed on Dec. 15, 2004, now abandoned.

(60) Provisional application No. 60/631,029, filed on Nov. 24, 2004.

(51) Int. Cl.
*C08K 5/02* (2006.01)

(52) U.S. Cl. .................. 524/463; 524/462; 524/795

(58) Field of Classification Search ........ 524/462–463, 524/795
See application file for complete search history.

(56) References Cited

U.S. PATENT DOCUMENTS

| | | | |
|---|---|---|---|
| 3,810,874 A | 5/1974 | Mitsch et al. | |
| 3,919,351 A | 11/1975 | Chang et al. | |
| 4,271,258 A | 6/1981 | Watariguchi | |
| 4,303,761 A * | 12/1981 | Apotheker | 525/200 |
| 4,512,848 A | 4/1985 | Deckman et al. | |
| 4,514,439 A | 4/1985 | Rounds | |
| 4,517,337 A | 5/1985 | Lockhart et al. | |
| 4,544,572 A | 10/1985 | Sandvig et al. | |
| 4,552,833 A | 11/1985 | Ito et al. | |
| 4,614,667 A | 9/1986 | Larson et al. | |
| 4,617,238 A | 10/1986 | Crivello et al. | |
| 4,687,707 A | 8/1987 | Matsuo et al. | |
| 4,722,878 A | 2/1988 | Watakabe et al. | |
| 4,731,155 A | 3/1988 | Napoli et al. | |
| 4,808,511 A | 2/1989 | Holmes | |
| 4,826,943 A | 5/1989 | Ito et al. | |
| 4,931,351 A | 6/1990 | McColgin et al. | |
| 4,959,252 A | 9/1990 | Bonnebat et al. | |
| 4,988,274 A | 1/1991 | Kenmochi | |
| 5,028,366 A | 7/1991 | Harakal et al. | |
| 5,108,875 A | 4/1992 | Thackeray et al. | |
| 5,169,494 A | 12/1992 | Hashimoto et al. | |
| 5,204,381 A | 4/1993 | Zeigler | |
| 5,206,983 A | 5/1993 | Guckel et al. | |
| 5,234,793 A | 8/1993 | Sebald et al. | |
| 5,242,711 A | 9/1993 | DeNatale et al. | |
| 5,259,926 A | 11/1993 | Kuwabara et al. | |
| 5,298,556 A * | 3/1994 | Stephens | 524/860 |
| 5,314,731 A | 5/1994 | Yoneda et al. | |
| 5,318,870 A | 6/1994 | Hartney | |
| 5,331,020 A | 7/1994 | Brown et al. | |
| 5,369,722 A | 11/1994 | Heming et al. | |
| 5,374,454 A | 12/1994 | Bickford et al. | |
| 5,380,474 A | 1/1995 | Rye et al. | |
| 5,389,696 A | 2/1995 | Dempsey et al. | |
| 5,397,669 A * | 3/1995 | Rao | 430/114 |
| 5,417,802 A | 5/1995 | Obeng | |
| 5,425,848 A | 6/1995 | Haisma et al. | |
| 5,439,766 A | 8/1995 | Day et al. | |
| 5,482,768 A | 1/1996 | Kawasato et al. | |
| 5,512,131 A | 4/1996 | Kumar et al. | |
| 5,523,878 A | 6/1996 | Wallace et al. | |
| 5,527,662 A | 6/1996 | Hashimoto et al. | |
| 5,542,978 A | 8/1996 | Kindt-Larsen et al. | |
| 5,545,367 A | 8/1996 | Bae et al. | |
| 5,569,691 A * | 10/1996 | Guggenberger et al. | 524/261 |
| 5,594,042 A | 1/1997 | Glover et al. | |

(Continued)

FOREIGN PATENT DOCUMENTS

JP 61-40845 2/1986

(Continued)

OTHER PUBLICATIONS

Yoneda et al., Translation of Japanese Patent 02-248480, Transparent Substrate with Water-Repellent and Antistaining Properties, and Structure Equipped Therewith Oct. 4, 1990.

(Continued)

*Primary Examiner*—Peter Szekely
(74) *Attorney, Agent, or Firm*—Fish & Richardson P.C.

(57) ABSTRACT

The present invention provides compositions that feature improved preferential adhesion and release characteristics with respect to a substrate and a mold having imprinting material disposed therebetween. To that end, the compositions facilitate bifurcation of the imprinting into a surfactant-component-rich sub-portion and a surfactant-component-depleted sub-portion located between said surfactant-component-rich sub-portion and said substrate. This surfactant-component-rich sub-portion attenuates the adhesion forces between the mold and the imprinting material, once solidified.

24 Claims, 6 Drawing Sheets

U.S. PATENT DOCUMENTS

| | | | |
|---|---|---|---|
| 5,601,641 A | 2/1997 | Stephens | |
| 5,629,095 A | 5/1997 | Bujanowski et al. | |
| 5,669,303 A | 9/1997 | Maracas et al. | |
| 5,725,788 A | 3/1998 | Maracas et al. | |
| 5,772,905 A | 6/1998 | Chou | |
| 5,776,748 A | 7/1998 | Singhvi et al. | |
| 5,820,769 A | 10/1998 | Chou | |
| 5,837,314 A | 11/1998 | Beaton et al. | |
| 5,849,209 A | 12/1998 | Kindt-Larsen et al. | |
| 5,849,222 A | 12/1998 | Jen et al. | |
| 5,861,467 A | 1/1999 | Bujanowski et al. | |
| 5,888,650 A | 3/1999 | Calhoun et al. | |
| 5,905,104 A | 5/1999 | Eklund et al. | |
| 5,948,470 A | 9/1999 | Harrison et al. | |
| 5,956,216 A | 9/1999 | Chou | |
| 5,969,063 A * | 10/1999 | Parker et al. | 526/200 |
| 6,066,269 A | 5/2000 | Wei et al. | |
| 6,093,455 A * | 7/2000 | Kamen et al. | 427/511 |
| 6,114,404 A | 9/2000 | Deeken et al. | |
| 6,117,708 A | 9/2000 | Wensel | |
| 6,132,632 A | 10/2000 | Haney et al. | |
| 6,169,139 B1 * | 1/2001 | van Cleeff | 524/544 |
| 6,174,931 B1 | 1/2001 | Moon et al. | |
| 6,190,929 B1 | 2/2001 | Wang et al. | |
| 6,204,343 B1 | 3/2001 | Barucha et al. | |
| 6,218,316 B1 | 4/2001 | Marsh | |
| 6,276,273 B1 * | 8/2001 | Aurenty et al. | 101/457 |
| 6,309,580 B1 | 10/2001 | Chou | |
| 6,316,290 B1 | 11/2001 | Wensel | |
| 6,334,960 B1 | 1/2002 | Willson et al. | |
| 6,335,149 B1 | 1/2002 | Xu et al. | |
| 6,342,097 B1 | 1/2002 | Terry et al. | |
| 6,344,105 B1 | 2/2002 | Daugherty et al. | |
| 6,355,198 B1 | 3/2002 | Kim et al. | |
| 6,372,838 B1 * | 4/2002 | Rao et al. | 524/462 |
| 6,389,696 B1 | 5/2002 | Heil et al. | |
| 6,391,217 B2 | 5/2002 | Schaffer et al. | |
| 6,447,919 B1 * | 9/2002 | Brown et al. | 428/422 |
| 6,468,642 B1 | 10/2002 | Bray et al. | |
| 6,468,896 B2 | 10/2002 | Rohr et al. | |
| 6,475,704 B1 | 11/2002 | Iwasaki et al. | |
| 6,482,742 B1 | 11/2002 | Chou | |
| 6,495,624 B1 | 12/2002 | Brown | |
| 6,503,914 B1 | 1/2003 | Benish et al. | |
| 6,517,995 B1 | 2/2003 | Jacobson et al. | |
| 6,518,168 B1 | 2/2003 | Clem et al. | |
| 6,518,189 B1 | 2/2003 | Chou | |
| 6,541,356 B2 | 4/2003 | Fogel et al. | |
| 6,544,594 B2 | 4/2003 | Linford et al. | |
| 6,565,776 B1 | 5/2003 | Li et al. | |
| 6,580,172 B2 | 6/2003 | Mancini et al. | |
| 6,583,248 B1 | 6/2003 | Bowen | |
| 6,600,207 B2 | 7/2003 | Huang et al. | |
| 6,646,662 B1 | 11/2003 | Nebashi et al. | |
| 6,649,272 B2 | 11/2003 | Moore et al. | |
| 6,664,306 B2 | 12/2003 | Gaddam et al. | |
| 6,696,157 B1 | 2/2004 | David et al. | |
| 6,696,220 B2 | 2/2004 | Bailey et al. | |
| 6,713,238 B1 | 3/2004 | Chou et al. | |
| 6,721,529 B2 | 4/2004 | Chen et al. | |
| 6,737,489 B2 | 5/2004 | Linert et al. | |
| 6,774,183 B1 | 8/2004 | Palumbo et al. | |
| 6,776,094 B1 | 8/2004 | Whitesides et al. | |
| 6,790,905 B2 | 9/2004 | Fitzgerald et al. | |
| 6,802,870 B2 | 10/2004 | Chang et al. | |
| 6,809,356 B2 | 10/2004 | Chou | |
| 6,828,244 B2 | 12/2004 | Chou | |
| 6,830,819 B2 | 12/2004 | Kaplan et al. | |
| 6,849,558 B2 | 2/2005 | Schaper | |
| 6,900,881 B2 | 5/2005 | Sreenivasan et al. | |
| 6,908,861 B2 | 6/2005 | Sreenivasan et al. | |
| 6,916,584 B2 | 7/2005 | Sreenivasan et al. | |
| 6,932,934 B2 | 8/2005 | Choi et al. | |
| 6,936,194 B2 | 8/2005 | Watts | |
| 2001/0044075 A1 | 11/2001 | Nishimura et al. | |
| 2002/0042027 A1 | 4/2002 | Chou et al. | |
| 2002/0126189 A1 * | 9/2002 | Gloster | 347/100 |
| 2002/0132482 A1 | 9/2002 | Chou | |
| 2002/0135099 A1 | 9/2002 | Robinson et al. | |
| 2002/0167117 A1 | 11/2002 | Chou | |
| 2002/0177319 A1 | 11/2002 | Chou | |
| 2003/0034329 A1 | 2/2003 | Chou | |
| 2003/0062334 A1 | 4/2003 | Lee et al. | |
| 2003/0080471 A1 | 5/2003 | Chou | |
| 2003/0080472 A1 | 5/2003 | Chou | |
| 2003/0129542 A1 | 7/2003 | Shih et al. | |
| 2003/0166814 A1 * | 9/2003 | Sparrowe et al. | 526/319 |
| 2003/0235787 A1 | 12/2003 | Watts e al. | |
| 2004/0021866 A1 | 2/2004 | Watts et al. | |
| 2004/0022888 A1 | 2/2004 | Sreenivasan et al. | |
| 2004/0036201 A1 | 2/2004 | Chou et al. | |
| 2004/0046288 A1 | 3/2004 | Chou | |
| 2004/0065252 A1 | 4/2004 | Sreenivasan et al. | |
| 2004/0110856 A1 | 6/2004 | Young et al. | |
| 2004/0112862 A1 | 6/2004 | Willson et al. | |
| 2004/0116548 A1 | 6/2004 | Willson et al. | |
| 2004/0118809 A1 | 6/2004 | Chou et al. | |
| 2004/0124566 A1 | 7/2004 | Sreenivasan et al. | |
| 2004/0131718 A1 | 7/2004 | Chou et al. | |
| 2004/0137734 A1 | 7/2004 | Chou et al. | |
| 2004/0156108 A1 | 8/2004 | Chou et al. | |
| 2004/0168613 A1 | 9/2004 | Nguyen et al. | |
| 2004/0170770 A1 | 9/2004 | Nguyen et al. | |
| 2004/0192041 A1 | 9/2004 | Jeong et al. | |
| 2004/0197843 A1 | 10/2004 | Chou et al. | |
| 2004/0202865 A1 | 10/2004 | Homota et al. | |
| 2004/0202872 A1 | 10/2004 | Fang et al. | |
| 2004/0241338 A1 | 12/2004 | Foster et al. | |
| 2004/0250945 A1 | 12/2004 | Zheng et al. | |
| 2004/0256764 A1 | 12/2004 | Choi et al. | |
| 2005/0037143 A1 | 2/2005 | Chou et al. | |
| 2005/0051698 A1 | 3/2005 | Sreenivasan et al. | |
| 2005/0084804 A1 | 4/2005 | Truskett et al. | |
| 2005/0100830 A1 | 5/2005 | Xu et al. | |
| 2005/0118749 A1 | 6/2005 | Sakamoto et al. | |
| 2005/0156357 A1 | 7/2005 | Willson et al. | |
| 2005/0160934 A1 * | 7/2005 | Xu et al. | 101/454 |
| 2005/0187339 A1 * | 8/2005 | Xu et al. | 524/556 |
| 2005/0192421 A1 * | 9/2005 | Xu et al. | 528/23 |
| 2005/0236739 A1 | 10/2005 | Willson et al. | 264/327 |
| 2006/0035029 A1 * | 2/2006 | Xu et al. | 427/372.2 |
| 2006/0036051 A1 * | 2/2006 | Xu et al. | 526/279 |
| 2006/0062867 A1 * | 3/2006 | Choi et al. | 425/174.4 |
| 2006/0062922 A1 * | 3/2006 | Xu et al. | 427/372.2 |
| 2006/0076717 A1 * | 4/2006 | Sreenivasan et al. | 264/494 |
| 2006/0077374 A1 * | 4/2006 | Sreenivasan et al. | 355/72 |
| 2006/0081557 A1 * | 4/2006 | Xu et al. | 216/48 |
| 2006/0108710 A1 * | 5/2006 | Xu et al. | 264/293 |
| 2006/0145398 A1 * | 7/2006 | Bailey et al. | 264/338 |
| 2007/0017631 A1 * | 1/2007 | Xu | 156/272.2 |
| 2007/0021520 A1 * | 1/2007 | Xu | 522/1 |

FOREIGN PATENT DOCUMENTS

| | | |
|---|---|---|
| JP | 1-196749 | 8/1989 |
| JP | 02-24848 | 1/1990 |
| JP | 02-92603 | 4/1990 |
| JP | 02192045 | 7/1990 |
| JP | 2-248480 | 10/1990 |
| JP | 3-90345 | 4/1991 |
| JP | 9-278490 | 10/1997 |
| WO | WO87/02935 | 5/1987 |
| WO | WO99/05724 | 2/1999 |
| WO | WO 00/21689 | 4/2000 |

| WO | WO 01/47003 | 6/2001 |
| WO | WO 01/53889 | 7/2001 |

OTHER PUBLICATIONS

Yoneda et al., Translation of Japanese Patent 02-248480, Transparent Substrate Material with Water-Repellent and Anti-Staining Properties and Structure Equipped with Same Oct. 4, 1990.
Colburn et al., Dissertation for the Degree of Doctor of Philosophy, Step and Flash Imprint Lithography: A Low-Pressure Nanoimprint Lithography Aug. 1, 2001.
DuPont Zonyl Fluorochemical Intermediates, www.dupont.com/zonyl/pdf/intermediates.pdf; pp. 1-16 Jun. 21, 2003.
DuPont Zonyl UR, www.dupont.com/zonyl/pdf/UR.pdf; pp. 1-2 Jun. 21, 2003.
DuPont Zonyl FSN, www.dupont.com/zonyl/odi/FSN.pdf; pp. 1-2 Aug. 24, 2003.
Masurf FS-230, www.masonsurfactants.com/Products/Masurf_FS_230.htm; pp. 1-2 Apr. 5, 2004.
Feynman, There's Plenty of Room at the Bottom, Dec. 1, 1959.
Hu et al., Fluorescence Probe Techniques (FPT) for Measuring the Relative Efficiencies of Free-Radical Photoinitiators, Macromolecules 1998, 31, pp. 4107-4113 May 29, 1998.
Blomquist et al., Fluorinated Acrylates in making Low-Loss, Low-Birefringence, and Single-Mode Optical Waveguides with Exceptional Thermo-Optic Properties, SPIE Conference on Linear Optical Properties of Waveguides and Fibers, vol. 3799, pp. 266-279 Jul. 1, 1999.
Johnson et al., Advances in Step and Flash Imprint Lithography, SPIE Microlithography Conference Feb. 23, 2003.
Chou et al., Lithographically Induced Self-assembly of Periodic Polymer Micropillar Arrays, J. Vac. Sci. Technol. B 17 (6), pp. 3197-3202 Nov. 1, 1999.
Colburn et al., Step and Flash Imprint Lithography: A New Approach to High-Resolution Patterning, Proc. Of SPIE, vol. 3676 Mar. 1, 1999.
Kotachi et al., Si-Contining Positive Resist for ArF Excimer Laser Lithography, Photopolymer Science and Technology, pp. 615-622 Nov. 4, 1995.
Chou, Nanoimprint Lithography and Lithographically Induced Self-Assembly, MRS Bulletin, pp. 512-517 Jul. 1, 2001.
Choi et al., Design of Orientation Stages for Step and Flash Imprint Lithography, Precision Engineering, pp. 192-199 Jan. 1, 2001.
Cowie, Polymers: Chemistry and Physics of Modern Materials, 2nd Ed. Jan. 1, 1991.
Xia et al., Soft Lithography, Angew. Chem. Int. Ed., pp. 550-575 Jan. 1, 1998.
Chou et al., Imprint Lithography with Sub-10 nm Feature Size and High Throughput, Microelectronic Engineering 35, pp. 237-240 Jan. 1, 1997.
Haisma et al., Mold-assisted Nanolithography: A Process for Reliable Pattern Replication, J. Vac. Sci. Technol. B, pp. 4124-4128 Nov. 1, 1996.
Chou et al., Imprint of Sub-25 nm Vias and Trenches in Polymers, Appl. Phys. Lett. 67 (21) Nov. 20, 1995.
Krug et al., Fine Patterning of Thin Sol-gel Films, Journal of Non-Crystalline Solids 147 & 148, pp. 447-450 Jan. 1, 1992.
Bender et al., Fabrication of Nanostructures using a UV-based Imprint Technique, Microelectronic Engineering 53, pp. 233-236 Jan. 1, 2000.
Nguyen, Asymmetric Fluid-Structure Dynamics in Nanoscale Imprint Lithography, The University of Texas at Austin, pp. 1-111 Aug. 1, 2001.
Eldada et al., Robust Photopolymers for MCM, Board, and Backplane Optical Interconnects, SPIE vol. 3288, pp. 175-191 Jan. 1, 1998.
Eldada et al., Affordable WDM Components: The Polymer Solution, SPIE vol. 3234, pp. 161-174 Jan. 1, 1998.
Eldada et al., Advanced Polymer Sytems for Optoelectronic Integrated Circuit Applications, SPIE vol. 3006, pp. 344-361 Jan. 1, 1997.

Bender et al., Multiple Imprinting in UV-based Nanoimprint Lithography: Related Material Issues, Microelectronic Engineering 61-62, pp. 407-413 Jan. 1, 2002.
Colburn et al., Step and Flash Imprint Lithography for sub-100 nm Patterning, Proceedings of SPIE vol. 3997, pp. 453-457 Jan. 1, 2000.
Chou et al., Imprint Lithography with 25-Nanometer Resolution, Science vol. 272, pp. 85-87 Apr. 5, 1996.
Heidari, Nanoimprint Lithography at the 6 in. Wafer Scale, J. Vac. Sci. Technol. B 18(6), pp. 3557-3560 Nov. 1, 2000.
Abstract of Japanese Patent 02-92603, Aug. 12, 2004.
Translation of Japanese Patent 02-92603, Apr. 3, 1990.
Translation of Japanese Patent 02-24848, Jan. 26, 1990.
Abstract of Japanese Patent 02-24848, Jan. 26, 1990.
Hirai et al., Abstract of Mold Surface Treatment for Imprint Lithography, Journal of Photopolymer Science and Technology, pp. 457-462, vol. 14, No. 3 Aug. 1, 2001.
Hirai et al., Mold Surface Treatment for Imprint Lithography, Journal of Photopolymer Science and Technology, vol. 14, No. 3, pp. 457-462 Aug. 1, 2001.
Parikh et al., An Intrinsic Relationship between Molecular Structure in Self-Assembled n-Alkylsiloxane Monolayers and Deposition Temperature, Journal of Phys. Chem., pp. 7577-7590 Jul. 1, 1994.
Sagiv, Organized Monolayers by Absorption. 1. Formation and Structure of Oleophobic Mixed Monolayers on Solid Surfaces, Journal of the American Chemical Society/102:1 Jan. 2, 1980.
Roos et al., Nanoimprint Lithography with a Commercial 4 Inch Bond System for Hot embossing, Proceedings of SPIE vol. 4343, pp. 427-435 Oct. 1, 2001.
Roos et al., Abstract of Nanoimprint Lithography with a Commercial 4 Inch Bond System for Hot Embossing, Proceedings of SPIE vol. 4343, pp. 427-435 Oct. 1, 2001.
Sung et al., Abstract of Micro/nano-tribological Characteristics of Self-Assembled Monolayer and its Application in Nano-Structure Fabrication, Elsevier Science B.V., vol. 255, No. 7 Jul. 1, 2003.
Sung et al., Micro/nano-tribological Characteristics of Self-Assembled Monolayer and its Application in Nano-Structure Fabrication, Elsevier Science B.V., vol. 255, No. 7, pp. 808-818 Jul. 1, 2003.
Papirer et al., Abstract of The Grafting of Perfluorinated Silanes onto the Surface of Silica: Characterization by Inverse Gas Chromatography, Journal of Colloid and Interface Science 159, pp. 238-242 Aug. 1, 1993.
Papirer et al., The Grafting of Perfluorinated Silanes onto the Surface of Silica: Characterization by Inverse Gas Chromatography, Journal of Colloid and Interface Science 159, pp. 238-242 Aug. 1, 1993.
Srinivasan et al., Alkyltrichlorosilane-Based Self-Assembled Monolayer Films for Stiction Reduction in Silicon Micromachines, Journal of Microelectromechanical Systems, vol. 7, No. 2, p. 252-260 Jun. 1, 1998.
Kim et al., Surface Energy and Polarity of Treated Indium-Tin-Oxide Anodes for Polymer Light-Emitting Diodes Studied by Contact-Angle Measurements, Journal of Applied Physics, vol. 86, No. 5, pp. 2774-2778 Aug. 4, 2004.
Chou et al., Ultrafast and Direct Imprint of Nanostructures in Silicon, Nature, col. 417, (Jun. 2002), pp. 835-837 Jun. 1, 2002.
Chou et al., Nanoimprint Lithography, Journal of Vacuum Science Technology B 14(16), pp. 4129-4133 Nov. 1, 1996.
Colburn et al., Development and Advantages of Step-and-Flash Lithography, Solid State Technology Jul. 1, 2001.
Colburn et al., Characterization and Modeling of Volumetric and Mechanical Properties for Step and Flash Imprint Lithography Photopolymers, Journal of Vacuum Science Technology, vol. b. 19(6) Nov. 1, 2001.
Sol-Gel Technology, www.chemat.com/html/solgel.html Jan. 14, 2004.
Sol-Gel Chemistry, www.prsc.usm.edu/mauritz/solgel.html Feb. 22, 2004.
Hakovirta et al., Optical Properties of Fluorinated Diamond-Like Carbon Films Produced by Pulsed Glow Discharge Plasma Immersion Ion Processing, Journal of Applied Physics 88(33); pp. 1456-1459 Aug. 1, 2000.

Yu et al., Properties of Fluorinated Amorphous Diamond Like Carbon Films by PECVD, Applied Surface Science 219 (3-4); pp. 228-237 Dec. 1, 2003.

Compon et al., Electroanalysis at Diamond-Like and Doped-Diamond Electrodes, Electroanalysis 15(17); pp. 1349-1363 Sep. 1, 2003.

Mansano et al., Protective Carbon Layer for Chemical Corrosion of Stainless Steel, Diamond and Related Materials 12 (3-7); pp. 749-752 Mar. 1, 2003.

Butter et al., Production and Wetting Properties of Fluorinated Diamond-Like Carbon Coatings, Thin Solid Films, 311(1-2); pp. 107-113 Dec. 31, 1997.

Hakovirta et al., Heat Resistance of Fluorinated Diamond-Like Carbon Films, Diamond and Related Materiasl 10(8); pp. 1486-1490 Aug. 1, 2001.

Zhu et al., The Improvement of the Oxidation Resistance of TiAl Alloys by Fluorine Plasma-Based Ion Implantation, Surface and Coatings Technology 158; pp. 502-507 Sep. 1, 2002.

Yao et al., Structural, Mechanical and Hydrophobic Properties of Fluorine-Doped Diamond-Like Carbon Films Synthesized by Plasma Immersion Ion Implantation and Deposition (PIII-D), Applied Surface Science 230; pp. 172-178 Apr. 17, 2004.

Bailey et al., Step and Flash Imprint Lithography: Defect Analysis, Journal of Vacuum Science, B 19(6), pp. 2806-2810 Nov. 1, 2001.

Bailey et al., Step and Flash Imprint Lithography: Template Surface Treatment and Defect Analysis, Journal of Vacuum Science, B 18(6), pp. 3572-3577 Nov. 1, 2000.

Schneider et al., Stripes of Partially Fluorinated Alkyl Chains: Dipolar Langmuir Monolayers, J. Chem. Phys. vol. 122, Issue 9 Mar. 1, 2005.

Data Sheet for MAK (Methyl n-Amyl Ketone), www.sp-chem.com/fine_e Jan. 1, 2003.

Data Sheet for gamma-Glycidoxypropyltrimethoxysilane, www.powerchemical.net/3100.htm Dec. 5, 2003.

Silicon or Silica, www.mil.org/Minerals/photosil Mar. 31, 2005.

Electronic Devices and Circuits, people.deas.harvard.edu/~jones/es154/lectures/lecture_2/materials/materials.html Mar. 31, 2005.

Data Sheet for Cymel 303ULF, www.cytec.com, 2003.

Data Sheet for Cycat 4040, www.cytec.com, 1990.

International Chemical Safety Card for p-Toluenseulfonic Acid, www.itcilo.it/english/actrav/telearn/osh/ic/104154.htm Dec. 5, 2003.

Data Sheet for p-Toluenesulfonic Acid, NIOSH Manual of Analytical Methods (NMAM), Fourth Edition, Jan. 15, 1998.

Data Sheet for Dow Corning Z-6018, 2001.

Data Sheet for Methyl Amyl Ketone, www.arb.ca.gov/db/solvents/solvent_pages/Ketones-HTML/methyl_amyl.htm Mar. 31, 2005.

Golden et al., Designing Porous Low-k Dielectrics, www.reed-electronics.com/semiconductor/index.asp?layout=articlePrint&articleID=CA82824 Apr. 6, 2005.

Padovani et al., Chemically Bonded Porogens in Methylsilsesquloxane: I. Structure and Bonding, Journal of the Electrochemical Society, 149(12) F161-F170 Oct. 16, 2002.

Wolf et al., Silicon Processing for the VLSI Era, vol. 1-Process Technology, pp. 407-413 Jan. 1, 1986.

Taniguchi et al., Diamond Nanoimprint Lithography, Nanotechnology, 2002, vol. 13, No. 5, pp. 592-596(5) Jan. 1, 2002.

Kiyohara et al., Abstract of Plasma Etching of CVD Diamond Films using an ECR-type Oxygen Source, http://www.iop.org/EJ/abstract/0957-4484/10/4/304 Sep. 26, 2003.

Wolf et al., Silicon Processing for the VLSI Era, vol. 1-Process Technology, pp. 541, 542, 544, 564, 565 Jan. 1, 1986.

Novec Fluorosurfactant FC-4432, http://multimedia.mmm.com/mws/mediawebserver.dyn?333333SQa783cMj3wMj333wyXuFliii)-1- Aug. 4, 2005.

Abstract of Japanese Patent 61-040845, Feb. 27, 1986.

Abstract of Japanese Patent 02-248480, Oct. 4, 1990.

Abstract of Japanese Patent 3-090345, Apr. 16, 1991.

Abstract of Japanese Patent 09-278490, Oct. 28, 1997.

Xu et al., Development of Imprint Materials for the Step and Flash Imprint Lithography Process, SPIE Microlithography Conference Feb. 1, 2004.

Nordquist et al., Image Placement Issues for ITO-based Step and Flash Imprint Lithography Templates, J. Vac. Sci. Technol. B, pp. 695-701 Mar. 1, 2004.

Resnick et al., Release Layers for Contact and Imprint Lithography, Semiconductor International, pp. 71-80 Jun. 1, 2002.

U.S. Appl. No. 10/978,285, naming Inventors Willson et al., entitled Step and Flash Imprint Lithography, filed Oct. 29, 2004.

U.S. Appl. No. 11/012,375, naming Inventors Xu et al., entitled Method to Reduce Adhesion between a Conformable Region and a Mold, filed Dec. 15, 2004.

U.S. Appl. No. 11/068,397, naming Inventors Xu et al., entitled Method of Providing Desirable Wetting and Release Characteristics Between a Mold and a Polyerizable Composition, filed Feb. 28, 2005.

\* cited by examiner

COMPOSITION TO REDUCE ADHESION BETWEEN A CONFORMABLE REGION AND A MOLD

CROSS-REFERENCE TO RELATED APPLICATIONS

The present application claims priority to U.S. Provisional Application No. 60/631,029, filed on Nov. 24, 2004, entitled "Imprinting Materials with Enhanced Filling Characteristics," listing Frank Y. Xu, Edward B. Fletcher and Van N. Truskett as inventors, the entirety of which is incorporated herein by reference.

In addition, the present application is a Continuation-in-Part of U.S. patent application Ser. No. 11/012,374 now abandoned, entitled "Composition to Reduce Adhesion Between a Conformable Region and a Mold," and a Continuation-in-Part of U.S. patent application Ser. No. 11/012,375 now abandoned, entitled "Method to Reduce Adhesion Between a Conformable Region and a Mold," both filed Dec. 15, 2004, both listing Frank Y. Xu and Michael N. Miller as inventors, and both of which are incorporated herein by reference.

Finally, the present application is a divisional patent application of U.S. patent application Ser. No. 11/068,397, filed on Feb. 28, 2005, (now abandoned). This application is incorporated by reference herein.

STATEMENT REGARDING FEDERALLY SPONSORED RESEARCH OR DEVELOPMENT

The United States government has a paid-up license in this invention and the right in limited circumstance to require the patent owner to license others on reasonable terms as provided by the terms of 70NANB4H3012 awarded by National Institute of Standards (NIST) ATP Award.

BACKGROUND OF THE INVENTION

The field of invention relates generally to nano-fabrication of structures. More particularly, the present invention is directed to compositions suited for patterning substrates in furtherance of the formation of structures employing imprint lithographic processes.

Nano-scale fabrication involves the fabrication of very small structures, e.g., having features on the order of one nano-meter or more. A promising process for use in nano-scale fabrication is known as imprint lithography. Exemplary imprint lithography processes are described in detail in numerous publications, such as United States published patent application 2004-0065976 filed as U.S. patent application Ser. No. 10/264,960, entitled "Method and a Mold to Arrange Features on a Substrate to Replicate Features having Minimal Dimensional Variability"; United States published patent application 2004-0065252 filed as U.S. patent application Ser. No. 10/264,926, entitled "Method of Forming a Layer on a Substrate to Facilitate Fabrication of Metrology Standards"; and United States published patent application 2004-0046271 filed as U.S. patent application Ser. No. 10/235,314, entitled "Method and a Mold to Arrange Features on a Substrate to Replicate Features having Minimal Dimensions Variability"; all of which are assigned to the assignee of the present invention.

Referring to FIG. 1, the basic concept behind imprint lithography is forming a relief pattern on a substrate that may function as, inter alia, an etching mask so that a pattern may be formed into the substrate that corresponds to the relief pattern. System 10 employed to form the relief pattern includes stage 11 upon which substrate 12 is supported. Template 14 has a mold 16 with a patterning surface 18 thereon. Patterning surface 18 may be substantially smooth and/or planar, or may be patterned so that one or more recesses are formed therein. Template 14 is coupled to imprint head 20 to facilitate movement of template 14. Fluid dispense system 22 is coupled to be selectively placed in fluid communication with substrate 12 so as to deposit polymerizable material 24 thereon. Source 26 of energy 28 is coupled to direct energy 28 along a path 30. Imprint head 20 and stage 11 are configured to arrange mold 16 and substrate 12, respectively, to be in superimposition, and disposed in path 30. Either imprint head 20, stage 11, or both vary a distance between mold 16 and substrate 12 to define a desired volume therebetween that is filled by polymerizable material 24.

Typically, polymerizable material 24 is disposed upon substrate 12 before the desired volume is defined between mold 16 and substrate 12. However, polymerizable material 24 may fill the volume after the desired volume has been obtained. After the desired volume is filled with polymerizable material 24, source 26 produces energy 28, which causes polymerizable material 24 to solidify and/or cross-link, forming polymeric material conforming to the shape of the substrate surface 24 and mold surface 18. Control of this process is regulated by processor 32 that is in data communication with stage 11, imprint head 20, fluid dispense system 22, and source 26, operating on a computer readable program stored in memory 34.

An important characteristic with accurately forming the pattern in the polymerizable material is to reduce, if not prevent, adhesion to the mold of the polymeric material, while ensuring suitable adhesion to the substrate. This is referred to as preferential release and adhesion properties. In this manner, the pattern recorded in the polymeric material is not distorted during separation of the mold therefrom. Prior art attempts to improve the release characteristics employ a release layer on the surface of the mold. The release layer is typically hydrophobic and/or has low surface energy. The release layer adheres to the mold. Providing the release layer improves release characteristics by minimizing distortions in the pattern recorded into the polymeric material that are attributable to mold separation. This type of release layer is referred to, for purposes of the present discussion, as an a priori release layer, i.e., a release layer that is solidified to the mold.

Another prior art attempt to improve release properties is described by Bender et al. in *Multiple Imprinting in UV-based Nanoimprint Lithography: Related Material Issues*, Microeletronic Engineering 61-62 (2002), pp. 407-413. Specifically, Bender et al. employ a mold having an a priori release layer in conjunction with a fluorine-treated UV curable material. To that end, a UV curable layer is applied to a substrate by spin-coating a 200 cPs UV curable fluid to form a UV curable layer. The UV curable layer is enriched with fluorine groups to improve the release properties.

A priori release layers, however, typically have a limited operational life. As a result, a single mold may be coated multiple times with an a priori release layer. This can result in several hours of down-time for a given mold, reducing throughput. Additionally, the molecular structure of the a priori release layer may limit the minimization of the minimum feature dimension that is printed.

There is a need, therefore, to improve the preferential release and adhesion properties of a mold employed in imprint lithography processes.

SUMMARY OF THE INVENTION

The present invention provides compositions that feature improved preferential adhesion and release characteristics with respect to a substrate and a mold having imprinting material disposed therebetween. The compositions facilitate bifurcation of the imprinting material into a surfactant-component-rich sub-portion and a surfactant-component-depleted sub-portion located between said surfactant-component-rich sub-portion and said substrate. This surfactant-component-rich sub-portion attenuates the adhesion forces between the mold and the imprinting material, once solidified. Specifically, the surfactant component has opposed ends. In the liquid phase, one of the opposed ends has an affinity for the bulk material. The remaining end has a fluorine component. As a result of the affinity for the bulk material, the surfactant component is orientated so that the fluorine component extends from an air-liquid interface defined by the imprinting material and the surrounding ambient. Upon solidification of the imprinting material, a lamella remains, positioned between the solidified imprinting material and the mold. The lamella results from the presence and location of the fluorine components in the surfactant-component-rich sub-portion. As a result, it has been determined that several materials could be employed in imprint lithography processes. Specifically, the bulk materials and surfactant component combinations employed in a composition of imprinting material are selected to provide the desired preferential adhesion and release properties. Exemplary compositions include an initiator component and compounds selected from a set of compounds consisting essentially of vinyl ethers, methacrylates, acrylates, thiol-enes, epoxies, as well as a surfactant component, having opposed ends, one of which has an affinity for said bulk material and the remaining end having a fluorine component. These and other embodiments are described herein.

DETAILED DESCRIPTION OF THE INVENTION

Figure 1:
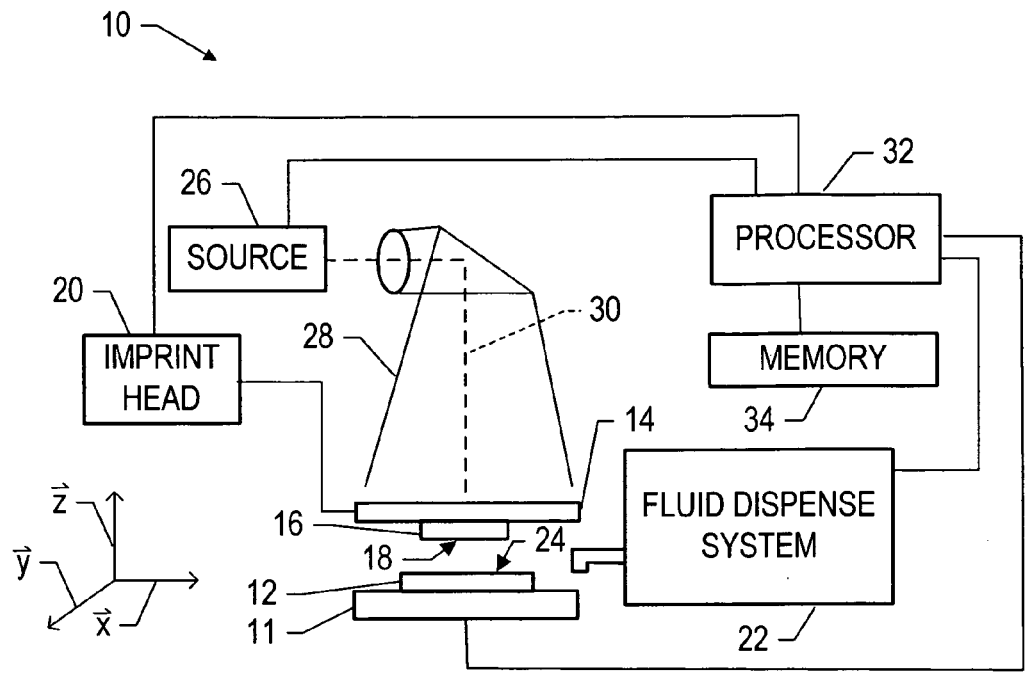
FIG. 1 is a perspective view of a lithographic system in accordance with the prior art.
Figure 2:
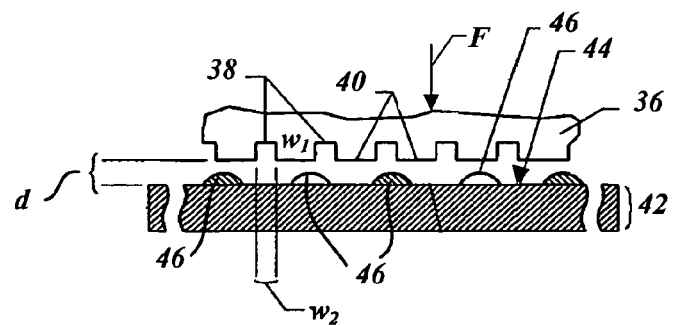
FIG. 2 is a simplified elevation view of a template and imprint material disposed on a substrate in accordance with the present invention.

Referring to FIGS. 1 and 2, a mold 36, in accordance with the present invention, may be employed in system 10, and may define a surface having a substantially smooth or planar profile (not shown). Alternatively, mold 36 may include features defined by a plurality of spaced-apart recessions 38 and protrusions 40. The plurality of features defines an original pattern that is to be transferred into substrate 42. Substrate 42 may comprise a bare wafer or a wafer with one or more layers disposed thereon. To that end, reduced is a distance "d" between mold 36 and substrate 42. In this manner, the features on mold 36 may be imprinted into a conformable region of substrate 42, such as an imprinting material disposed on a portion of surface 44 that presents a substantially planar profile. It should be understood that the imprinting material may be deposited using any known technique, e.g., spin-coating, dip coating and the like. In the present example, however, the imprinting material is deposited as a plurality of spaced-apart discrete droplets 46 on substrate 42. Imprinting layer 34 is formed from a composition that may be selectively polymerized and cross-linked to record the original pattern therein, defining a recorded pattern.

Specifically, the pattern recorded in the imprinting material is produced, in part, by interaction with mold 36, e.g., electrical interaction, magnetic interaction, thermal interaction, mechanical interaction and the like. In the present example, mold 36 comes into mechanical contact with the imprinting material, spreading droplets 36, so as to generate a contiguous formation 50 of the imprinting material over surface 44. In one embodiment, distance "d" is reduced to allow sub-portions 52 of imprinting layer 34 to ingress into and fill recessions 38.

To facilitate filling of recessions 38, the imprinting material is provided with the requisite properties to completely fill recessions 38 while covering surface 44 with a contiguous formation of the imprinting material. In the present embodiment, sub-portions 54 of imprinting layer 34 in superimposition with protrusions 40 remain after the desired, usually minimum distance "d" has been reached. This action provides formation 50 with sub-portions 52 having a thickness $t_1$, and sub-portions 54, having a thickness $t_2$. Thicknesses "$t_1$" and "$t_2$" may be any thickness desired, dependent upon the application. Thereafter, formation 50 is solidified by exposing the same to the appropriate curing agent, e.g., actinic radiation. This causes the imprinting material to polymerize and cross-link. The entire process may occur at ambient temperatures and pressures, or in an environmentally controlled chamber with desired temperatures and pressures. In this manner, formation 50 is solidified to provide side 56 thereof with a shape conforming to a shape of a surface 58 of mold 36.

Figure 3:
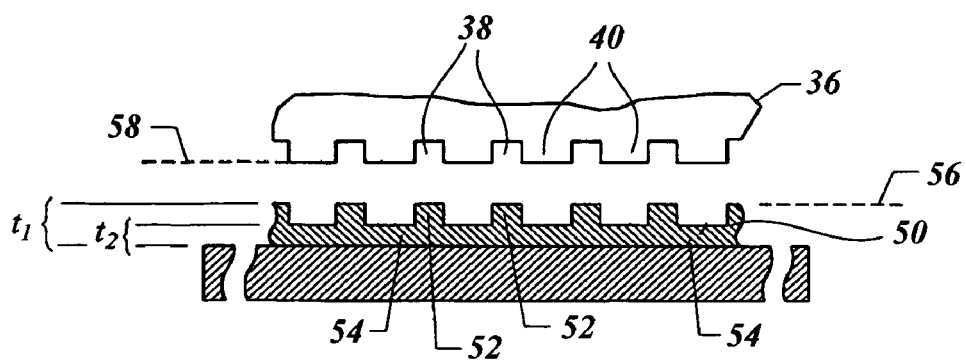
FIG. 3 is a simplified elevation view of the template and substrate shown in FIG. 2, with the imprinting material being shown as patterned and solidified.
Figure 4:
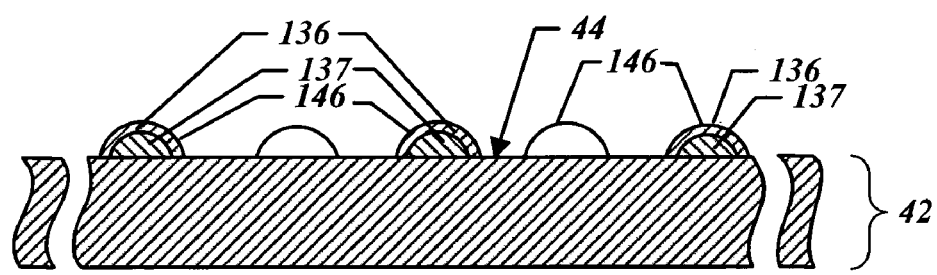
FIG. 4 is a detailed view of the droplets of imprint material, shown in FIG. 2, showing the bifurcation of the droplets into surfactant-rich regions and surfactant-depleted regions.

Referring to FIGS. 1, 2 and 3, the characteristics of the imprinting material are important to efficiently pattern substrate 42 in light of the unique patterning process employed. For example, it is desired that the imprinting material have certain characteristics to facilitate rapid and even filling of the features of mold 36 so that all thicknesses $t_1$ are substantially uniform and all thicknesses $t_2$ are substantially uniform. To that end, it is desirable that the viscosity of the imprinting material be established, based upon the deposition process employed, to achieve the aforementioned characteristics. As mentioned above, the imprinting material may be deposited on substrate 42 employing various techniques. Were the imprinting material deposited as a plurality of discrete and spaced-apart droplets 46, it would be desirable that the composition from which the imprinting material is formed have relatively low viscosity, e.g., in a range of 0.5 to 20 centipoises (cps). Considering that the imprinting material is spread and patterned concurrently, with the pattern being subsequently solidified into formation 50 by exposure to radiation, it would be desired to have the composition wet surface of substrate 42 and/or mold 36 and to avoid subsequent pit or hole formation after polymerization. Were the imprinting material deposited employing spin coating techniques, it would be desired to use higher viscosity materials, e.g. having a viscosity greater than 10 cPs and typically, several hundred to several thousand cPs.

In addition to the aforementioned characteristics, referred to as liquid phase characteristics, it is desirable for the composition to provide the imprinting material with certain solidified phase characteristics. For example, after solidification of formation 50, it is desirable that preferential adhesion and release characteristics be demonstrated by the imprinting material. Specifically, it is beneficial for the composition from which the imprinting material is fabricated to provide formation 50 with preferential adhesion to substrate 42 and preferential release of mold 36. In this fashion, reduced is the probability of distortion in the recorded pattern resulting from the separation of mold 36 therefrom due to, inter alia, tearing, stretching or other structural degradation of formation 50.

The constituent components that form the imprinting material to provide the aforementioned characteristics may differ. This results from substrate 42 being formed from a number of different materials. As a result, the chemical composition of surface 44 varies dependent upon the material from which substrate 42 is formed. For example, substrate 42 may be formed from silicon, plastics, gallium arsenide, mercury telluride, and composites thereof. Additionally, substrate 42 may include one or more layers, e.g., dielectric layer, metal layer, semiconductor layer, planarization layer and the like, upon which formation 50 is generated. Additionally, mold 36 may be formed from several materials, e.g., fused-silica, quartz, indium tin oxide diamond-like carbon, MoSi, sol-gels and the like.

It has been found that the imprinting material from which formation 50 is generated may be fabricated from several different families of bulk materials. For example, the imprinting material may be fabricated from vinyl ethers, methacrylates, epoxies, thiol-enes and acrylates, just to name a few.

Exemplary bulk materials for the imprinting material are as follows:

VINYL ETHER/BULK MATERIAL-A1 triethyleneglycol divinyl ether
tris(4-vinyloxybutyl)trimellitate photoinitiator A first vinyl ether component, triethyleneglycol divinyl ether, has the following structure:

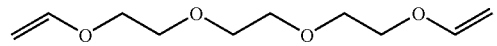

and comprises approximately 67.9% of the bulk material by weight. As a result, the mechanical properties of formation 50 are primarily attributable to triethyleneglycol divinyl ether. An exemplary source for triethyleneglycol divinyl ether is the BASF Corporation of Mount Olive, N.J. available under the product name DVE-3.

A second vinyl ether component tris(4-vinyloxybutyl) trimellitate has the following structure:

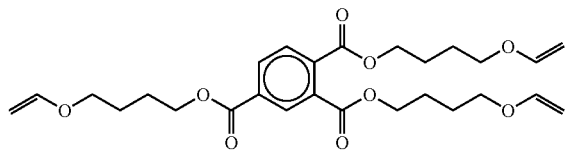

and comprises approximately 29.1% of the bulk material. The component tris(4-vinyloxybutyl)trimellitate is available from Morflex Inc. of Greensboro, N.C. under the tradename Vectomer 5015.

The photoinitiator component is a cationic photoinitiator that is a mixture of triarylsulfonium hexafluoroantimonate salts in propylene carbonate having the following structure:

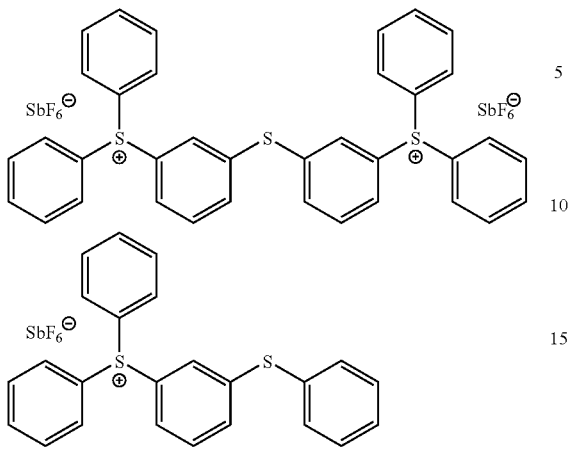

The photoinitiator component comprises approximately 3% of the bulk material and is available from the Dow Chemical Company of Midland, Mich. under the product name UVI 6976.

VINYL ETHER 2/BULK MATERIAL-A2 bis(4-vinyloxybutyl)adipate vinyl ether terminated polyester polymer photoinitiator A first vinyl ether component, bis(4-vinyloxybutyl)adipate, has the following structure:

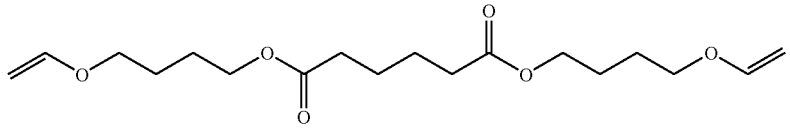

and comprises approximately 19.4% of the bulk material by weight. An exemplary source for bis(4-vinyloxybutyl)adipate is Morflex, Inc. of Greensboro, N.C. under the product name Vectomer 4060.

The second vinyl ether component is a vinyl ether terminated polyester polymer that comprises approximately 77.6% of the bulk material by weight. As a result, the mechanical properties of formation 50 are primarily attributable to the vinyl ether terminated polyester polymer. An exemplary source for the vinyl ether polyester polymer is Morflex, Inc. of Greensboro, N.C. under the product name Vectomer 1312. The photoinitiator comprises approximately 3% of the bulk material, by weight, and is that same as described above with respect to VINYL ETHER BULK MATERIAL 1: UVI 6976.

METHACRYLATE BULK MATERIAL-A3 organic modified silicate

An exemplary organic modified silicate ORMOSIL that may comprise 100% of the bulk material is Ormomer® b66 available from Micro Resist Technology GmbH, Berlin, Germany. The material is fabricated through a sol-gel process. Methacryl and epoxy functionality is attached to the material, with a photoinitiator component being incorporated for UV curing through the methacryl functionality.

EPOXY/BULK MATERIAL-A4 diglycidyl ether of bisphenol A cationic photoinitiator

The diglycidyl ether of bisphenol A component has the following structure:

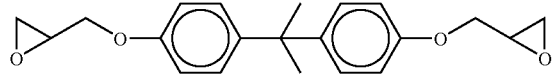

and comprises approximately 97% of the bulk material by weight. As a result, the mechanical properties of formation 50 are primarily attributable to the diglycidyl ether of bisphenol A component. An exemplary source of diglycidyl ether of bisphenol A is Dow Chemical Company of Midland, Mich. under the product name DER 332. The cationic photoinitiator component of the bulk material includes a mixture of triarylsulfonium hexafluorophosphate salts in propylene carbonate, providing the following structure:

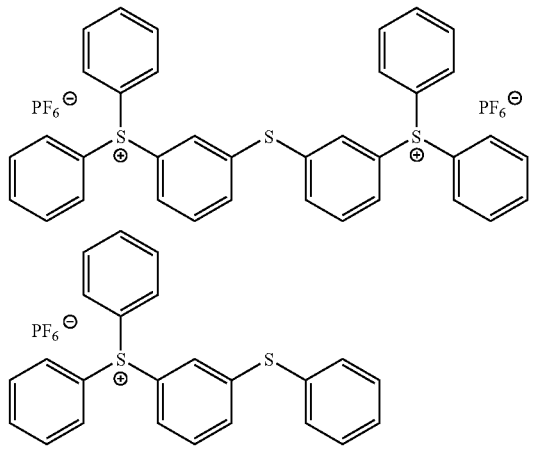

and comprises approximately 3% of the bulk material, by weight. An exemplary source of the cationic photoinitiator is Dow Chemical Company of Midland, Mich. under the product name UVI 6992.

THIOL-ENE/BULK MATERIAL-A5 triethyleneglycol divinyl ether
1,2-Bis(2-mercaptoethoxy)ethane triallyl
isocyanurate ethyl
2,4,6-trimethylbenzoylphenylphosphinate The vinyl ether component comprises approximately 36.7% of the bulk material by weight and has the structure discussed above with respect to the product sold under the product name DVE-3. The 1,2-Bis(2-mercaptoethoxy)ethane component has the following structure:

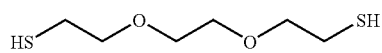

and comprises approximately 47.3% of the bulk material by weight. An exemplary source of the 1,2-Bis(2-mercaptoethoxy)ethane component is the Aldrich Chemical Company of Milwaukee, Wis. under the product name DMDO. As a result, the mechanical properties of formation 50 are primarily attributable to the triethyleneglycol divinyl ether and 1,2-Bis(2-mercaptoethoxy)ethane components.

The triallyl isocyanurate component has the following structure:

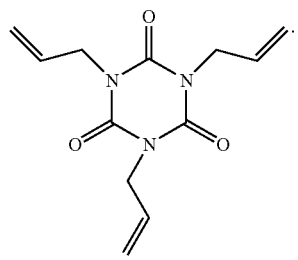

and comprises approximately 13% of the bulk material by weight. An exemplary source of the triallyl isocyanurate component is the Aldrich Chemical Company of Milwaukee, Wis. under the product name TAIC.

The ethyl 2,4,6-trimethylbenzoylphenyl-phosphinate component comprises approximate 3% of the bulk material by weight and has the following structure:

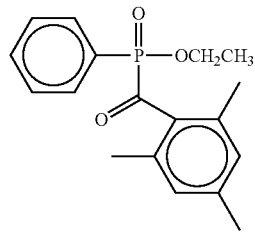

An exemplary source of the ethyl 2,4,6-trimethylbenzoylphenylphosphinate component is the BASF Corporation of Mount Olive, N.J. under the product name TPO-L.

ACRYLATE/BULK MATERIAL-A6 isobornyl acrylate n-hexyl acrylate ethylene glycol
diacrylate
2-hydroxy-2-methyl-1-phenyl-propan-1-one The acrylate component, isobornyl acrylate (IBOA), has the following structure:

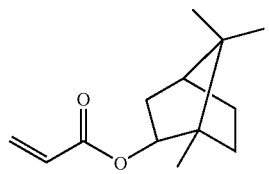

and comprises approximately 55% of bulk material by weight, but may be present in a range of 20% to 80%, inclusive. As a result, the mechanical properties of formation 50 are primarily attributable to IBOA. An exemplary source for IBOA is Sartomer Company, Inc. of Exton, Pa. available under the product name SR 506.

The component n-hexyl acrylate (n-HA) has the following structure:

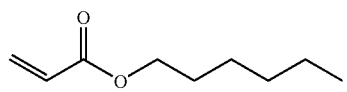

and comprises approximately 27% of bulk material by weight, but may be present in a range of 0% to 50%, inclusive. Also providing flexibility to formation 50, n-HA is employed to reduce the viscosity of the prior art bulk material so that bulk material, in the liquid phase, has a viscosity in a range 2-9 Centipoises, inclusive. An exemplary source for the n-HA component is the Aldrich Chemical Company of Milwaukee, Wis.

A cross-linking component, ethylene glycol diacrylate, has the following structure:

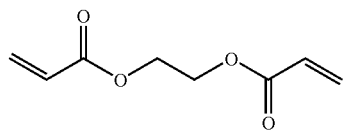

and comprises approximately 15% of bulk material by weight, and may be present in a range of 10% to 50%, inclusive. EGDA also contributes to the modulus and stiffness buildup, as well as facilitates cross-linking of n-HA and IBOA during polymerization of the bulk material.

An initiator component, 2-hydroxy-2-methyl-1-phenyl-propan-1-one is available from Ciba Specialty Chemicals of Tarrytown, N.Y. under the trade name DAROCUR® 1173, and has the following structure:

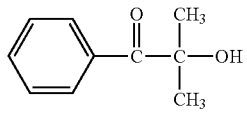
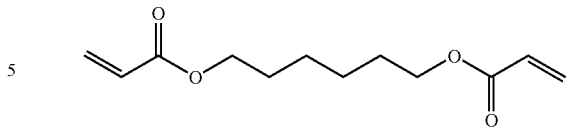

and comprises approximately 3% of the bulk material by weight, and may be present in a range of 1% to 5%, inclusive. The initiator is responsive to a broad band of ultra-violet radiation generated by a medium-pressure mercury lamp. In this manner, the initiator facilitates cross-linking and polymerization of the components of the bulk material.

ACRYLATE/BULK MATERIAL-A7 isobornyl acrylate n-hexyl acrylate ethylene glycol diacrylate
2-hydroxy-2-methyl-1-phenyl-propan-1-one As can be seen, BULK MATERIAL-A7 is identical to BULK MATERIAL-A6 in terms of the identity of the constituent components. The two materials differ in terms of the percentage of each of the constituent components present. In BULK MATERIAL-A7, IBOA comprises approximate 47% of the material by weight and n-HA and EGDA each comprises 25% of the bulk material by weight. DAROCUR® 1173, 2-hydroxy-2-methyl-1-phenyl-propan-1-one component comprises approximately 3% of the material by weight.

ACRYLATE/BULK MATERIAL-A8 genomer 1122 isobornyl acrylate 1,6-Hexanediol Diacrylate
2-hydroxy-2-methyl-1-phenyl-propan-1-one The first acrylate component, genomer 1122 is an aliphatic urethane acrylate available from Rahn USA Corporation of Aurora, Ill. and has the following structure:

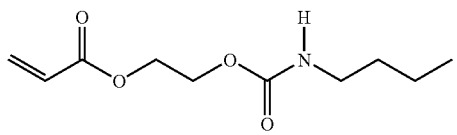

and comprises approximately 21% of the bulk material by weight, but may be present in a range of 0 to 50%. The acrylate component isobornyl acrylate (IBOA) is as described above and comprises approximately 56% by weight of the composition, but may be present in a range of 20 to 80%. The acrylate component 1,6-hexanediol diacrylate is available from UCB Chemicals, Smyna, Ga. and has the following structure:

and comprises approximately 20% of bulk material by weight, but may be present in a range of 10% to 50%, inclusive. The initiator component, 2-hydroxy-2-methyl-1-phenyl-propan-1-one is as described above and comprises approximately 3% of the composition by weight. To provide improved wetting characteristics of BULK MATERIAL A8, additional fluorinated acrylates, such as 1H,1H-perfluoro-n-decyl acrylate may be included to lower the contact angle of the same. This fluorinated acrylate is available from Exfluor Research Corporation, Round Rock, Tex. under the tradename C10ACRY. One advantage with bulk material A-8 is that it has a viscosity of approximately 11 cPs which makes the same suitable for both drop-dispense and spin-coating techniques.

It was discovered, however, that desirable preferential adhesion and release properties, as discussed above, may be achieved by producing a weak boundary layer, lamella 60, between mold 36, surface 58 and formation 50. Lamella 60 remains after solidification of the imprinting material. As a result, the adhesion forced between mold 36 and formation 50 is minimal. To that end, found beneficial was employing a composition for the imprinting material that includes one of the bulk materials discussed above along with a component that contains low surface energy groups, referred to herein as a surfactant component. After deposition of the imprinting material, the surfactant component rises, after a period of time, to the air liquid interface, providing droplets 146 of imprinting material with a bifurcated concentration of materials.

In a first portion, droplets 146 include a higher concentration of the surfactant component, referred to as a surfactant-component-rich (SCR) sub-portion 136, than the second portion, referred to as a surfactant-component-depleted (SCD) sub-portion 137. SCD sub-portion 137 is positioned between surface 44 and SCR sub-portion 136. SCR sub-portion 136 attenuates the adhesion forces between mold 36 and the imprinting material, once solidified. Specifically, the surfactant component has opposed ends. When the imprinting material is in the liquid phase, i.e., polymerizable, one of the opposed ends has an affinity for the bulk material included in the imprinting material. The remaining end has a fluorine component. As a result of the affinity for the bulk material, the surfactant component is orientated so that the fluorine component extends from an air-liquid interface defined by the imprinting material and the surrounding ambient. Upon solidification of the imprinting material, a first portion of the imprinting material generates a lamella 60 and a second portion of the imprinting material is solidified, i.e., polymeric material shown as formation 50. Lamella 60 is positioned between formation 50 and mold 36. Lamella 60 results from the presence and location of the fluorine components in the SCR sub-portion 136. Lamella 60 prevents strong adhesion forces from being developed between mold 36 and formation 50. Specifically, formation 50 has first and second opposed sides 62 and 64. Side 62 adheres to substrate 42 with a first adhesion force. Side 64 adheres to mold 36 with a second adhesion force. Lamella 60 results in the second adhesion force being less than the first adhesion force. As a result, mold 36 may be easily removed from formation 50 while minimizing distortions and/or the force required to separate mold 36 therefrom. Although formation 50 is shown with side 62 being patterned, it should be understood that side 62 may be smooth, if not planar. Furthermore, if desired, it is possible to generate lamella 60 so as to be disposed between formation 50 and substrate 42. This may be achieved, for example, by applying imprinting material to mold 36 and subsequently contacting substrate with the imprinting material. In this manner, it can be said that formation 50, i.e., polymeric material, will be disposed between lamella 60 and the body, mold 36 or substrate 42, upon which the polymerizable material is deposited.

Figure 5:
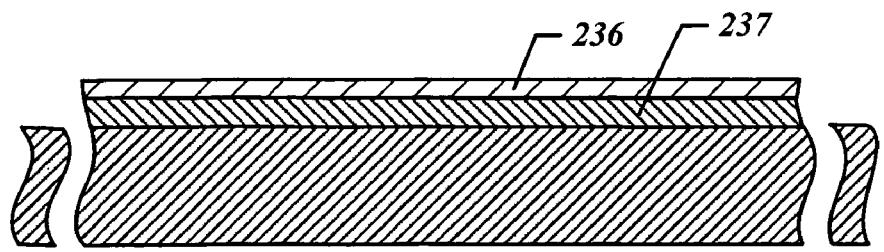
FIG. 5 is a detailed view of a layer of imprinting material, deposited employing spin-on techniques, showing the bifurcation of the layer into surfactant-rich regions and surfactant-depleted regions.
Figure 6:
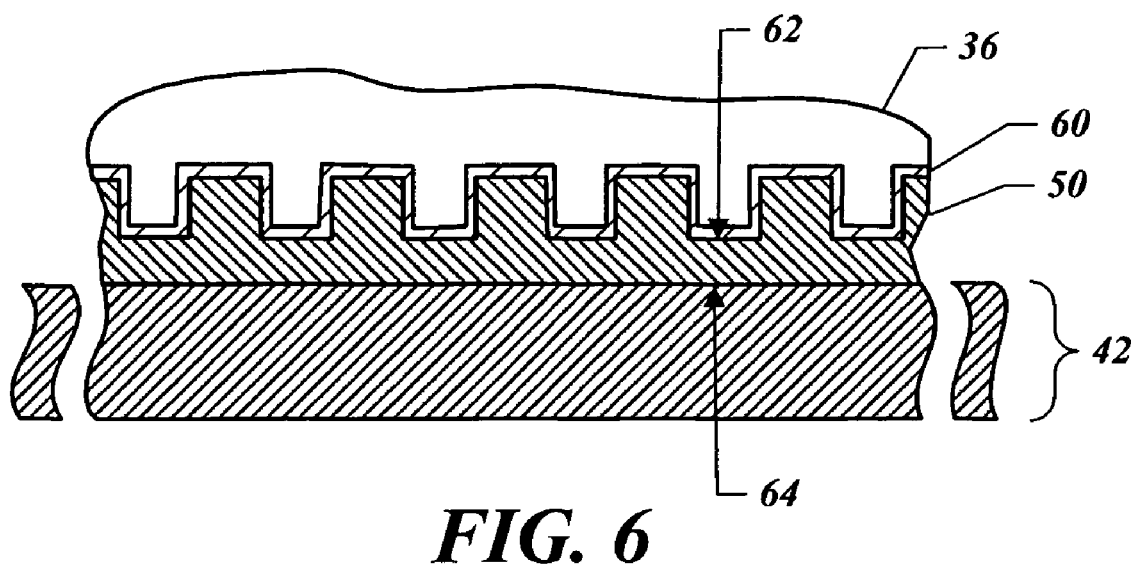
FIG. 6 is a cross-sectional view of the template contacting imprinting material, deposited as shown in either FIG. 4 or 5, demonstrating the formation of the weak boundary lamella between solidified imprinting material and a template.
Figure 7:
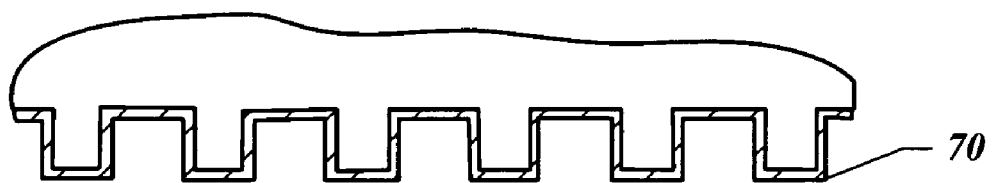
FIG. 7 is a cross-sectional view of the template shown in FIG. 6 having a layer of surfactant containing solution disposed thereon, in accordance with the present invention.

It should be understood that were the imprinting material deposited employing spin-coating techniques, similar bifurcated concentration of materials occurs, as shown in FIG. 5 with respect to SCR sub-portion 236 and second and SCD sub-portion 237. The time required for the bifurcation is dependent upon several factors, including the size of molecules in the imprinting material and the viscosity of the imprinting material. Only a few seconds is needed to achieve the aforementioned bifurcation of imprinting material with viscosity below twenty cPs. Imprinting material with viscosity in the hundreds of cPs, however, may require a few seconds to several minutes.

Various surfactant components, or combinations of surfactant components, can be included in the bulk materials to form lamella 60. These include nonionic fluorinated surfactant components having the following general formula:

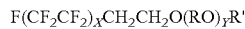

where $(RO)_Y$ is a poly(oxyalkylene) group, that includes groups having two to four carbon atoms such as —$CH_2CH_2$—, —$CH_2CH_2CH_2$—, —$CH(CH_3)CH_2$—, or —$CH(CH_3)CH(CH_3)$—, and R' is a terminal group of H or $C_1$ to $C_4$ alkyl, preferably H or methyl and X and Y are integers.

Another example of nonionic fluorinated surfactant components has the following general formula:

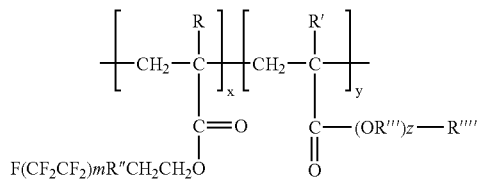

where R and R' can be either H or methyl; R and R' can be identical or differ. R" is a linking group that may be omitted or a sulfonyl group such as —$SO_2N(R'''')$—, with R'''' being $C_1$ to $C_6$ alkyl and typically $C_1$ to $C_4$ alkyl. The component $(OR''')_z$ is a poly(oxyalkylene) group, typically including groups having 2 to 4 carbon atoms such as —$CH_2CH_2$—, —$CH_2CH_2CH_2$—, —$CH(CH_3)CH_2$—, or —$CH(CH_3)CH(CH_3)$—. R'''' is a terminal group of methyl, H or $C_1$ to $C_4$ alkyl and typically H or methyl. The ratio of x to y is in a range of 1:2 to 3:1 and more preferably in a range of 1:1 to 2:1.

It should be understood that the oxyalkylene groups in the poly(oxyalkylene) group may be the same, as in poly(oxyethylene), or two or more of differing oxyalkylene units may be irregularly distributed in the poly(oxyalkylene) group. More specifically, the poly(oxyalkylene) group may be made up of straight or branched chain oxypropylene units alone or oxyethylene units alone, or straight or branched oxypropylene units and oxyethylene units may be present in alternate blocks. In the case of alternate blocks of oxyethylene and oxypropylene, the ratio the oxyethylene to oxypropylene is in a range of 2.0-0.5 to 1. Also, unattached blocks of poly(oxyalkylene) may be present in the polymer matrix. Chain transfer agents such as octyl mercaptan may be also present.

Exemplary nonionic fluorinated surfactant components that may be employed are fluoro-aliphatic polymeric esters, fluorosurfactants of the polyoxyethylene or polyalkyl ether type, or fluoroalkyl polyethers as set forth in U.S. Pat. Nos. 3,403,122, 3,787,351, 4,803,145, 4,835,084, 4,845,008, 5,380,644, 5,747,234, and 6,664,354 which are incorporated herein by reference. Suitable commercially available examples of the surfactant components included are sold by Dupont under product names ZONYL® FSO, ZONYL® FSO-100, ZONYL® FSN-100, ZONYL® FS-300; sold by 3M Company under the product names FC-4432, FC-4430, FC430; sold by Mason Chemical Company of Arlington Heights, Ill. under the product names MASURF® FS425, MASURF® FS1700, MASURF® FS-2000, MASURF® FS-1230; sold by Ciba-Geigy Corp under the product names Lodyne S-107B, Lodyne S-220N, Lodyne S-222N; sold by Daikin of Japan under the product names Unidyne NS1602, Unidyne NS1603, Unidyne NS1606a; and sold by Dainippon Ink & Chemical under the product name MegaFace R-08. In addition to, or in lieu of the nonionic fluorinated surfactant components, ionic fluorinated surfactant components may be employed in the composition from which the imprinting material is formed, along with the bulk materials discussed above.

In lieu of, or in addition to, the non-ionic fluorinated surfactant components, the ionic type of fluorinated surfactant components can work as well. An exemplary ionic surfactant is an anionic phosphate fluorosurfactant sold by DuPont of Wilmington, Del. under the tradename ZONYL® UR, which has the following formula:

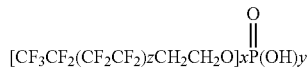

wherein, x=1 or 2, y=2 or 1, x+y=3, z=0 to about 6. In addition to ZONYL® UR, other anionic surfactant components based upon fluorinated phosphoric, polyphosphoric acid ester, sulfonic acid ester, alkyl surface and carboxylic acid ester types may be employed.

In lieu of, or in addition to, the non-ionic and anionic surfactant components, a zwitterionic surfactant may be employed with the bulk materials discussed above for the composition from which the imprinting material is fabricated. An exemplary zwitterionic surfactant has the following general formula:

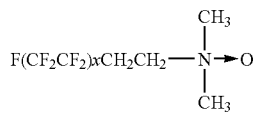

A commercially available zwitterionic surfactant is a fluoroaliphatic amine oxide available from the Mason Chemical Company under the tradename MASURF® FS230. Cationic surfactant components may be employed, as well, such as fluorinated surfactant components like quaternary ammonium salts available from DuPont under the trade name ZONYL® FSD which has the following formula:

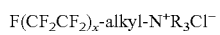

where x is an integer in a range of 1 to 7, inclusive. Additionally a surfactant containing both fluorine and silicon atoms can work, as well. An exemplary surfactant containing silicon is MEGAFACE® R-08 mentioned above.

Although the foregoing has been discussed with respect to having fluorine-containing surfactant components, it is possible to employ non-fluorine-containing surfactant components. This is particularly useful when a mixture of surfactant components is employed, wherein one of the surfactant components is fluorine-containing with the remaining surfactant components of the mixture of surfactant components being a non-fluorine-containing surfactant and/or a fluorine-containing surfactant. An exemplary mixture of surfactant components may include one or more of the fluorine-containing surfactant components described above. The remaining surfactant components may be one or more of a siloxane-based-surfactant and/or a hydrocarbon-based-surfactant. Examples of siloxane-based surfactant components are available from Dow Corning of Midland, Mich. under the trade names Q2-5211 and SYLGARD® 309, both of which are trisiloxane-type surfactant components. Siloxane polyether types may be employed, as well.

Hydrocarbon surfactant components suitable for use in the present invention include any that facilitate providing a composition with low "dynamic" surface tension and/or increasing the solubility of the fluorinated surfactant into the bulk materials. Exemplary hydrocarbon surfactant components are available from BASF of Ontario, Canada under the tradename TETRONIC®, e.g., TETRONIC® 701, which are believed to be tetrafunctional block copolymers of propylene oxide, ethylene oxide, and ethylene diamine. Other hydrocarbon surfactant components are available from Dow Chemical Company of Midland, Mich. under the trade names TERGITOL® and TRITON®, e.g., TERGITOL® NP-10, TRITON® X-100 and TRITON® X-45. The TERGITOL® surfactant components are alkyl polyethylene oxides, and the TRITON® surfactant components are alkyl phenyl polyethylene oxides. Uniqema Americas of New Castle, Del. also provides suitable hydrocarbon surfactant components containing polyethoxylated alcohols and esters under the tradename BRIJ®, e.g., BRIJ® 30. Acetylenic polyethlene oxide-containing hydrocarbon surfactant components are available from Air Products and Chemicals, Inc. of Allentown, Pa. under the trade names SULFYNOL® and DYNOL®, e.g., SULFYNOL® 104, SULFYNOL® 440, SULFYNOL® 2502, and DYNOL® 604.

Typically, the composition formed employing the bulk materials mentioned above includes a quantity of surfactant components, or mixture of surfactant components, that is in a range of 0.05% to 5% of the composition by weight, and more particularly 0.25% to 2% by weight. The remaining portion of the composition comprises one or more of the bulk materials, described above. Typically the composition from which the imprinting material is fabricated is applied employing drop-dispense techniques at room temperatures and in the presence of a helium-purged environment, e.g., a helium-saturated atmosphere. The drop-dispense technique is employed for compositions having viscosities in a range of 1-20 cPs at room temperature. For higher viscosity compositions, e.g., in a range of 10-500,000 cPs, but more particularly, compositions from 10-20,000 cPs, at room temperature, spin-coating techniques may be employed.

To demonstrate the improved preferential adhesion and preferential release provided by the presence of the surfactant components described above in imprinting material, several compositions including the bulk materials and surfactant components described above were tested. Specifically, the following surfactant components were employed:

S1

FC-4430

As mentioned above, the surfactant FC-4430 is available from the 3M Company of St. Paul, Minn. as the NOVEC® Fluorosurfactant FC-4430. The NOVEC® FC-4430 fluorosurfactant is a non-ionic acrylic copolymer based fluorochemical surfactant containing perfluorobutane sulfonate (PFBS) segments.

S2

FS-1230

The surfactant FS-1230 is believed to originate from Asahi Glass, in Japan and distributed in the United States of America by Mason Chemical of Arlington Heights, Ill. under the product name MASURF® FS-1230 and has the following general formula:

where X and Y are integers. MASURF® FS-1230 is a 30% active fluoroaliphatic polyoxyethylene fluorosurfactant in a water/isopropanol solution. In the experiments that resulted in the data recited below, the water and isopropanol were removed before the surfactant was incorporated into the composition for the imprinting material.

S3

FSO-100

The surfactant FSO-100 is an ethoxylated nonionic fluorosurfactant that has the following structure:

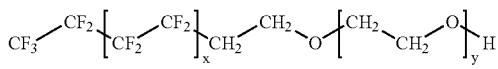

where x is an integer in a range of 0 to 6, inclusive; and y is an integer in a range of 0 to 15, inclusive.

S4

FC-4432

As mentioned above, the surfactant FC-4432 is available from the 3M Company of St. Paul, Minn. as the NOVEC® Fluorosurfactant FC-4432. It is a non-ionic polymeric fluorochemical surfactant. The NOVEC® FC-4432 fluorosurfactant is based on perfluorobutane sulfonate (PFBS) chemistry.

S5

F021004

The component F021004 is a surfactant-like component that is available from Fluorous Technologies, Inc. of Pittsburgh, Pa. The chemical name is Diisopropyl(1H,1H,2H,2H-perfluorododecyl)silane. The surfactant-like component F021004 has the following structure:

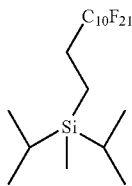

S6

ZONYL® UR

The surfactant ZONYL® UR is an anionic phosphate fluorosurfactant available from Dupont of Wilmington, Del. that has the following structure:

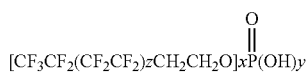

where x is an integer having a value of 1 or 2; y is an integer having a value of 2 or 1; Z is an integer having a value in a range of 0 to 6, inclusive, where x+y=3.

S7

Combination of FSO-100 and R-08

The surfactant R-08 is a nonionic fluorinated acrylic copolymer based surfactant. As mentioned above, the surfactant R-08 is available from Dainippon Ink & Chemical of Japan under the product name is MEGAFACE® R-08. The combination surfactant S7 is 50% FSO-100 and 50% R-08.

S8

Combination of FSO-100 SURFYNOL® 104

The surfactant SURFYNOL® 104 is an acetylenic hydrocarbon-based surfactant having the chemical name 2,4,7,9-tetramethyl-5-decyne-4,7-diol. The surfactant SURFYNOL® is available from Air Products and Chemicals, Inc. of Allentown, Pa. and has the following structure:

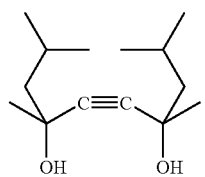

The combination surfactant S8 is 50% FSO-100 and 50% SURFYNOL® 104.

The surfactant components and bulk materials described above were employed to formulate additional compositions to generate comparative data of the preferential adhesion and preferential release properties with respect to the twelve compositions and the eight bulk materials, discussed above. The compositions and/or bulk materials were deposited and then solidified between two glass slides. Each glass slide was approximately 1 mm thick, 75×25 mm in the lateral dimension. Droplets of fluidic imprinting material were disposed on a glass slide; the second slide was laid in a cross direction pattern. The imprinting material was subsequently cured. A four-point bending compression force was applied to separate the slides. To that end, a four-point bending fixture (not shown) was adopted for the adhesion test and technique, similar to that described in "Measurement of Adhesive Force Between Mold and Photocurable Resin in Imprint Technology" Japanese Journal of Applied Physics, Vol. 41 (2002) pp. 4194-4197. The maximum force/load was taken as the adhesion value. The beam distance of the top and bottom two points is 60 mm. The load was applied at the speed of 0.5 mm per minute. The compositions and test results are as shown in FIG. 8.

Figure 8:
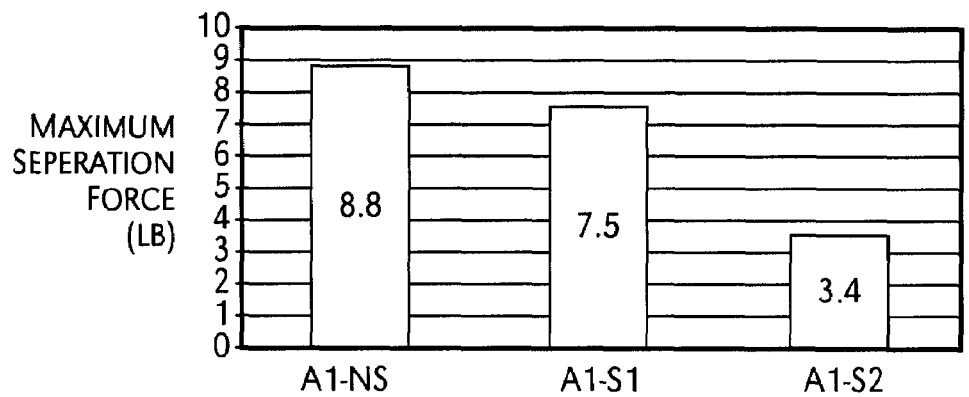
FIG. 8 is a table illustrating compositions and test results for Bulk Material A1.

As seen in FIG. 8 only 3.4 pounds of separation force is required to separate superimposed glass-slides (not shown) having a cured imprinting material disposed therebetween formed from a composition bulk material A1 and surfactant S2, shown as A1-S2. This is much less than the 7.5 pounds of separation force required to separate cured imprinting material formed from a composition of about 99.5% bulk material A1 and about 0.5% surfactant S1, shown as A1-S1. More telling is the 61% reduction in the separation force realized when compared to the separation force required to separate superimposed glass slides (not shown) having a cured bulk material A1, disposed therebetween, not having a surfactant included therein, shown as A1-NS. The A1-NS, A1-S1 and A1-S2 compositions each have a room temperature viscosity of approximately 8 cPs and deposited at room temperature employing drop-dispense techniques. The A1-S2 composition consisted of approximately 99.5% of bulk material A1 and 0.5% of surfactant S2. The A1-S1 composition consisted of approximately 99.5% of bulk material A1 and 0.5% of surfactant S1.

Figure 9:
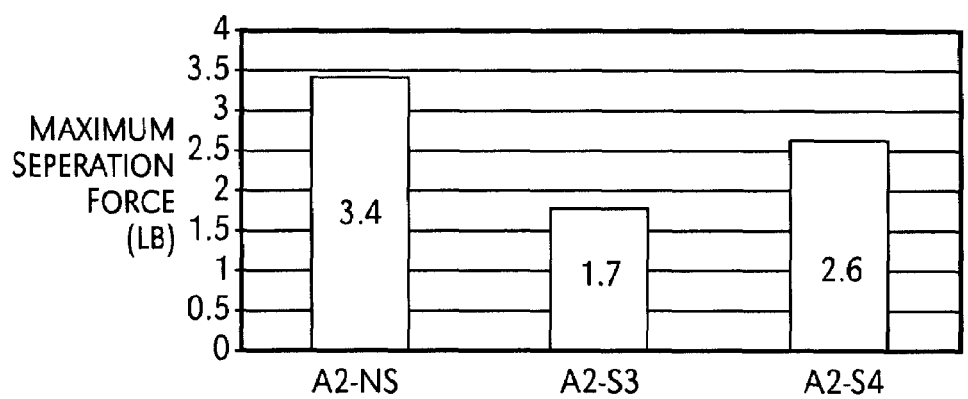
FIG. 9 is a table illustrating separation data utilizing Bulk Material A2.

As seen from the separation data concerning bulk material A2 shown in FIG. 9, 1.7 pounds of separation force was required to separate superimposed glass-slides (not shown) having cured imprinting material. A composition containing bulk material A2 and surfactant S3, shown as A2-S3 was employed to form the cured imprinting material. This separation force required is much less than the 2.6 pounds of separation force required in the presence of cured imprinting material formed from a composition of bulk material A2 and surfactant S4, shown as A2-S4. More telling is the 50% reduction in the separation force realized when compared to the separation force required to separate superimposed glass slides (not shown) having a cured bulk material A2, disposed therebetween, in the absence of a surfactant, shown as A2-NS. The A2-NS, A2-S3 and A2-S4 compositions each has a room temperature viscosity of approximately 300 cPs and deposited at room temperature employing spin-on techniques. The A2-S3 composition consisted of approximately 99.5% of bulk material A2 and 0.5% of surfactant S3. The A2-S4 composition consisted of approximately 99.5% of bulk material A2 and 0.5% of surfactant S4.

Figure 10:
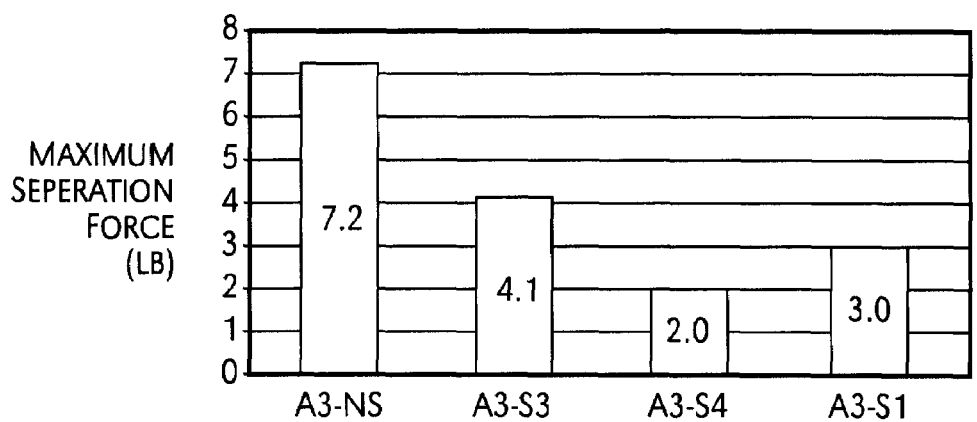
FIG. 10 is a table illustrating separation data utilizing Bulk Material A3.

As seen from the separation data concerning bulk material A3 shown in FIG. 10, only 2.0 pounds of separation force was required to separate superimposed glass-slides (not shown) having a cured imprinting material disposed therebetween. The cured imprinting material was formed from a composition containing bulk material A3 and surfactant S4, shown as A3-S4. This is much less than the 3.0 pounds of separation force required in the presence of cured imprinting material formed from composition of bulk material A3 and surfactant S1, shown as A3-S1. The separation force associated with A3-S4 is also less than the separation force required in the presence of cured imprinting material formed from a composition of bulk material A3 and surfactant S3, shown as A3-S3. More telling is the 72% reduction in the separation force realized when compared to the separation force required to separate superimposed glass slides (not shown) having a cured bulk material A3, disposed therebetween, in the absence of a surfactant, shown as A3-NS. The A3-NS, A3-S1, A3-S3 and A3-S4 compositions each has a room temperature viscosity in a range of approximately 10,000 to 12,000 cPs, inclusive, and deposited at room temperature employing spin-on techniques. The A3-S1 composition consisted of approximately 99.5% of bulk material A3 and 0.5% of surfactant S1. The A3-S3 composition consisted of approximately 99.5% of bulk material A3 and 0.5% of surfactant S3. The A3-S4 composition consisted of approximately 99.5% of bulk material A3 and 0.5% of surfactant S4.

Figure 11:
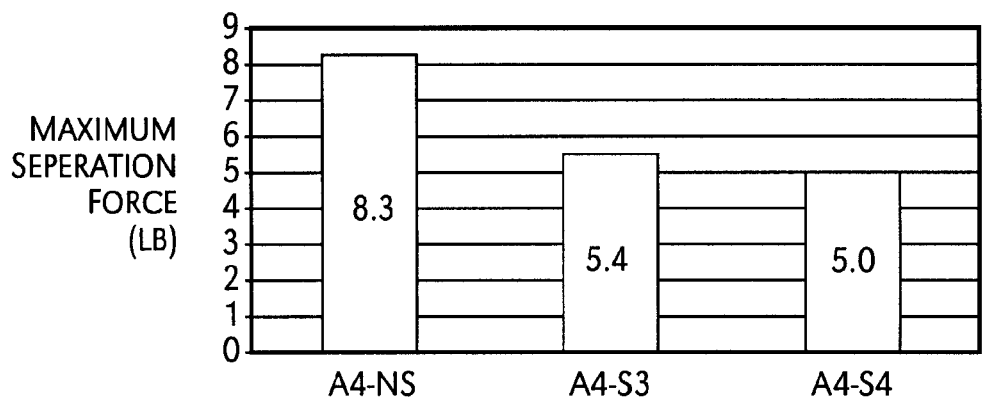
FIG. 11 is a table illustrating separation data utilizing Bulk Material A4.

As seen from the separation data concerning bulk material A4 shown in FIG. 11, the reduction of forces required for separating the superimposed glass-slides (not shown) having a cured composition disposed therebetween containing bulk material A4 and surfactant S4, shown as A4-S4, required only 5.0 pounds. This is less than the 5.4 pounds of separation force required for a composition of bulk material A4 and surfactant S3, shown as A4-S3. More telling is the 40% reduction in the separation force realized when compared to the separation force required to separate superimposed glass slides (not shown) having a cured bulk material A4, disposed therebetween, in the absence of a surfactant, shown as A4-NS. The A4-NS, A4-S3 and A4-S4 compositions each has a room temperature viscosity approximately 5,000 cPs and deposited at room temperature employing spin-on techniques. The A4-S1 composition consisted of approximately 99.5% of bulk material A4 and 0.5% of surfactant S1. The A4-S3 composition consisted of approximately 99.5% of bulk material A4 and 0.5% of surfactant S3. The A4-S4 composition consisted of approximately 99.5% of bulk material A4 and 0.5% of surfactant S4.

Figure 12:
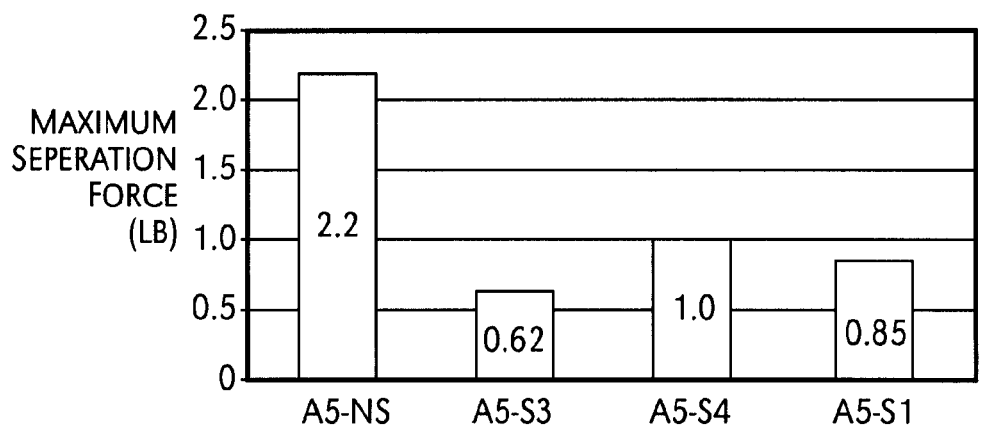
FIG. 12 is a table illustrating separation data utilizing Bulk Material A5.

As seen from the separation data concerning bulk material A5 shown in FIG. 12, only 0.62 pounds of separation force is required for separating the superimposed glass-slides (not shown) having a cured imprinting material disposed therebetween. The cured imprinting material was formed from a composition of bulk material A5 and surfactant S3, shown as A5-S3. This is less than the separation force required for cured imprinting material formed from a composition of either bulk material A5 and surfactant S1, shown as A5-S1 or bulk material A5 and surfactant S4, shown as A5-S4. More telling is the 72% reduction in the separation force realized when compared to the separation force required to separate superimposed glass slides (not shown) having a cured bulk material A5, disposed therebetween, in the absence of a surfactant, shown as A5-NS. The A5-NS, A5-S1, A5-S3 and A5-S4 compositions each has a room temperature viscosity in a range of approximately 20 to 30 cPs, inclusive, and deposited at room temperature employing spin-on techniques. The A5-S1 composition consisted of approximately 99.5% of bulk material A5 and 0.5% of surfactant S1. The A5-S3 composition consisted of approximately 99.5% of bulk material A5 and 0.5% of surfactant S3. The A5-S4 composition consisted of approximately 99.5% of bulk material A5 and 0.5% of surfactant S4.

Figure 13:
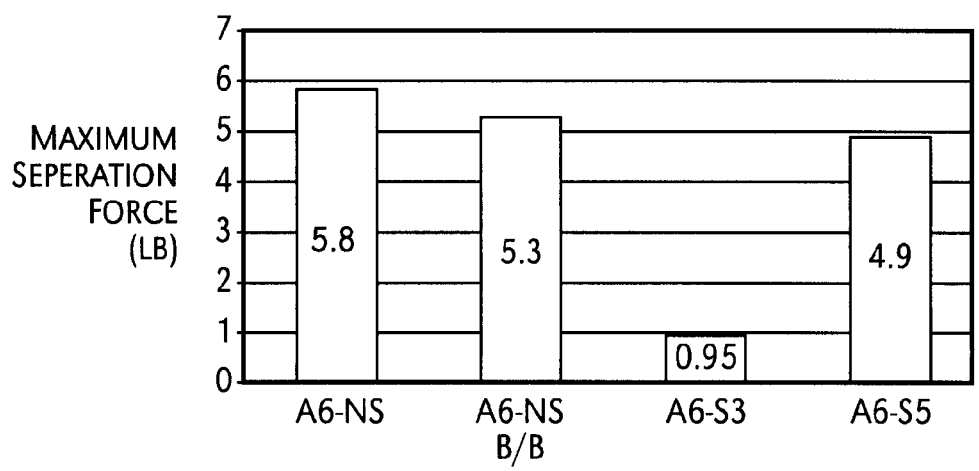
FIG. 13 is a table illustrating separation force data utiliing Bulk Material A6.

The separation force data concerning bulk material A6 shown in FIG. 13 in the absence of a surfactant being cured between two superimposed transfer layers is shown as A6-NS B/B. Specifically, each of two superimposed glass slides (not shown) has a layer of DUV30J formed thereon. DUV30J is available from Brewer Science, Inc. of Rolla, Mo. It is desired that the cured bulk material A6 adheres well to the transfer layer (not shown) and easily releases from the surface of an imprint template (not shown). Also shown is the separation force data concerning bulk material A6 in the absence of a surfactant with respect to being cured between two superimposed glass slides (not shown) having no previous layer thereon, shown as A6-NS.

As seen for the separation data concerning bulk material A6 shown in FIG. 13, the separation force required for separating the superimposed glass-slides (not shown), without the aforementioned transfer layer being present and having a cured composition disposed therebetween containing bulk material A6 and surfactant S3, shown as A6-S3, required only 0.95 pounds. This is less than the pounds of separation force required for a composition of bulk material A6 and surfactant S5, shown as A6-S5 or the separation forces required for A6-NS B/B. More telling is the 84% reduction in the separation force realized when compared to the separation force required to separate superimposed glass slides (not shown) having a cured bulk material A6-NS.

The data suggests that selective adhesion has been achieved. Although S3 and S5 have perfluoro-hydrophobic groups, S3 appears to be much more efficient in reducing the adhesion than S5. It is believed, therefore, that structure variations of the fluorinated additives will have significant impacts on the release performance. For example, S3 has a surfactant molecule that contains both a hydrophobic tail and a hydrophilic head, which as shown provides desirable release characteristics. The A6-NS, A6-S3 and A6-S5 compositions have a room temperature viscosity of approximately 4 cPs and deposited at room temperature employing drop-dispense techniques. The A6-S3 composition consisted of approximately 99.5% of bulk material A6 and 0.5% of surfactant S3. The A6-S5 composition consisted of approximately 99.5% of bulk material A6 and 0.5% of surfactant S5.

Figure 14:
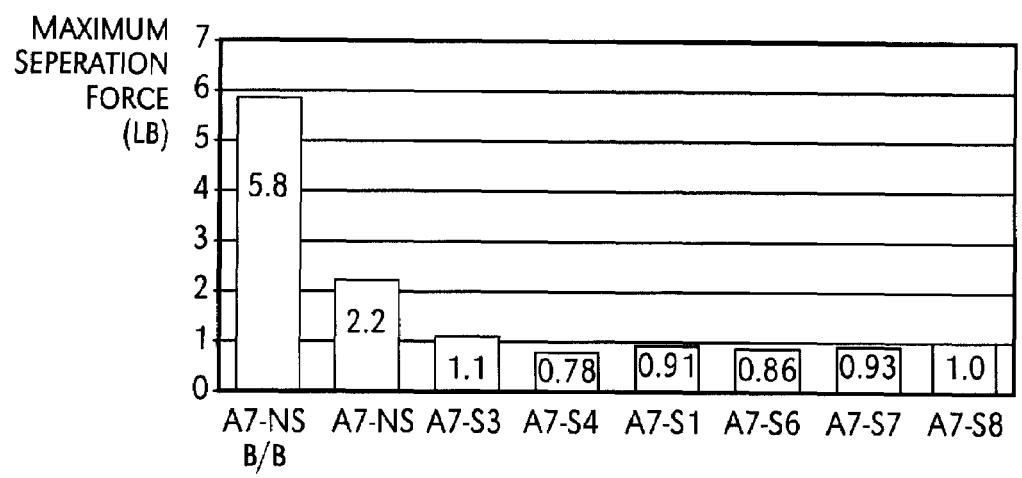
FIG. 14 is a table illustrating separation force data utilizing Bulk Material A7.

The separation force data concerning bulk material A7 shown in FIG. 14 in the absence of a surfactant being cured between two superimposed transfer layers is shown as A7-NS B/B. Specifically, each of two superimposed glass slides (not shown) has a layer of DUV30J formed thereon, as discussed above. Also shown is the separation force data concerning bulk material A7 in the absence of a surfactant with respect to being cured between two superimposed glass slides (not shown) having no previous layer thereon, shown as A7-NS. As is expected from a review of the previous data, the presence of surfactant components provides greatly improved release properties for compositions imprinting material including bulk material A7. Also demonstrated is the success of combination surfactant components, such as S7 and S8, in reducing the separation force required. The A7-NS, A7-S1, A7-S3, A7-S4, A7-S5, A7-S6, A7-S7 and A7-S8 compositions each has a room temperature viscosity of approximately 4 cPs and deposited at room temperature employing drop-dispense techniques. The A7-S1 composition consisted of approximately 99.5% of bulk material A7 and 0.5% of surfactant S1. The A7-S3 composition consisted of approximately 99.5% of bulk material A7 and 0.5% of surfactant S3. The A7-S4 composition consisted of approximately 99.5% of bulk material A7 and 0.5% of surfactant S4. The A7-S5 composition consisted of approximately 99.5% of bulk material A7 and 0.5% of surfactant S5. The A7-S6 composition consisted of approximately 99.5% of bulk material A7 and 0.5% of surfactant S6. The A7-S7 composition consisted of approximately 99.5% of bulk material A7 and 0.5% of surfactant S7. The A7-S8 composition consisted of approximately 99.5% of bulk material A7 and 0.5% of surfactant S8.

Referring to FIG. 2, one consideration with providing surfactants is that introduction of the same into imprinting material may increase the time required to fill the features of mold 36. As mentioned above, layer 70 is formed on surface 58 that results from contact with the imprinting material. The release properties provided by the surfactants result from the hydrophobicity of the same, which conflict with the wetting characteristics that are desired to rapidly cover the features of mold 36. Specifically, it is believed that, in the case of surfactants that include fluorine-atoms within a molecule, too great a quantity of the fluorine atoms within a molecule and coupling with too great a quantity of the fluorine-containing molecules results in the generation of clusters of fluorine-containing molecules. These clusters, especially with $CF_3$ end groups extending from the air-liquid interface, is believed to provide layer 70 with an undesirable hydrophobicity profile that may substantially affect the wetting characteristics of the imprinting material with respect to surface 58.

It is believed that by appropriately distributing the fluorine atoms within a surfactant molecule, as well as the distribution of the fluorine-containing molecules throughout the volume of layer 70, and therefore, referred to collectively as the distribution of the fluorine atoms throughout the volume, an acceptable hydrophobicity profile may be achieved. Upon achieving the desired distribution of fluorine atoms within a surfactant molecule and fluorine-containing molecules in layer 70, lamella layer 60 is provided with an optimum fluorine density to provide the desired preferential release and adhesion, without unduly limiting the wettability of surface 58 by the imprinting material. As a result satisfactory fill and release properties are provided to the imprint process. This typically occurs upon lamella layer 60 having a thickness of approximately 1 nm.

One manner, in which to determine that the desired distribution of fluorine atoms within a surfactant molecule and fluorine-containing molecules are present involves measuring the contact angle of the imprinting material in contact with surface 58. To that end, a goniometer is used for contact angle measurement. Molds 56 formed from fused silica were cleaned in a piranha solution and stored in a nitrogen purged environment. The piranha solution consisted of a mixture of 2 parts concentrated $H_2SO_4$ and 1 part $H_2O_2$ mixed at room temperature. Mold 36 is then rinsed with a surfactant component Isopropyl Alcohol (IPA) mixture, e.g., the IPA mixture contained 0.01% of the surfactant component with the remainder consisting essential of IPA. After the rinse, mold 36 was subjected to a stream of nitrogen fluid, e.g., nitrogen gas, to blow-dry the same. Once again, mold 36 was exposed to the same IPA mixture and then dried by exposure to the nitrogen fluid stream. Droplets of imprinting material were then deposited upon mold 36 in volumes of in a range of 2 μl to 5 μl, approximately. Measured is the contact angle of several different droplets located at various locations over surface 58. In the present example contact angle measurements are made corresponding to 7 different locations on mold 36, using the goniometer. An average value of the seven contact angle measurements are made to obtain the final contact angle values. Considering that layer 70 is replenished each time the same contacts imprinting material on substrate, the foregoing experiment is believed to be an accurate determination of the relative wetting properties of differing imprinting material compositions.

The contact angle, surfactant treatment solution, and filling performance are shown below Wettability Characteristics for Bulk Material A7-1

| | Surfactant | | | | |
|---|---|---|---|---|---|
| | FSO-100 | FC-4430 & FC-4432 | FC-4430& R-08 | R-08 | R-08 & FS-1230 |
| Contact Angle | 43.2° | 20.2° | 13.8° | 17.3° | 22.7° |

Bulk material A7-1 is identical to BULK MATERIAL-A7 in terms of the identity of the constituent components, excepting the addition of a surfactant component. The two materials differ in terms of the percentage of each of the constituent components present. In Bulk Material A7-1, approximately 46.875% of the composition by weight is IBOA, 24.875% of the composition by weight is nHA, 24.875% of the composition by weight is EGDA, 2.875% of the composition by weight is Darocur 1173; and approximately 0.5% of the composition being a surfactant component. Specifically, with 0.5% of the Bulk Material A7-1 consisting of the surfactant FSO-100, the least desirable wettability characteristics are provided. The contact angle is the greatest at 43.2°. Compare the contact angle of 13.8° provided upon Bulk Material A7-1 consisting of 0.5% of the combination surfactant R-08 and FC-4430, wherein R-08 and FC-4430 each comprises 0.25% of Bulk Material A7-1. As a result, the time required to fill the features of mold 36 is less for layer 70 including combination surfactant R-08 and FC-4430 than for layer 70 including FSO-100. For the remaining measurements, a contact angle of approximately 20.2° when the combination surfactant FC-4430 and FC-4432 included in the Bulk Material A7-1 wherein FC-4430 comprises approximately 0.333% of the composition by weight and FC-4432 comprises approximately 0.167% of the composition by weight. Another surfactant combination consisting of R-08 and FS-1230 presented a contact angle of approximately 22.7°, in which R-08 comprised of approximately 0.4% by weight of Bulk Material A7-1, by weight, and FS-1230 comprised of approximately 0.1% of Bulk Material A7-1, by weight.

Wettability Characteristics for Bulk Material A8-1

| | Surfactant | | | | | |
|---|---|---|---|---|---|---|
| | FSO-100 | FC-4432 | FC-4430 | FS-2000 | R-08 | S-222N |
| Contact Angle | 49.7° | 26.5° | 17.2° | 21.4° | 18.2° | 19.2° |

Bulk material A8-1 is identical to BULK MATERIAL-A8 in terms of the identity of the constituent components, excepting the addition of a surfactant component. The two materials differ in terms of the percentage of each of the constituent components present. In Bulk Material A8-1, approximately 20.875% of the composition by weight is the acrylate component Genomer 1122 and 55.875% of the composition by weight is IBOA. The acrylate component HDODA is approximately 19.875% by weight, and Darocur 1173 is approximately 2.875% of the composition by weight. The remaining 0.5% of the composition is a surfactant component. Specifically, with 0.5% of the Bulk Material A8-1 consisting of FSO-100, the least desirable wettability characteristics are provided. The contact angle is the greatest at 49.7°. Compare the contact angle of 17.2% provided upon Bulk Material A8-1 consisting of 0.5% of the surfactant FC-4430. As a result, the time required to fill the features of mold 36 is less for layer 70 including surfactant FC-4430 than for layer 70 including FSO-100. For the remaining measurements, a contact angle of approximately 18.2° was presented when the R-08 surfactant is included in Bulk Material A8-1. With surfactant S-222N included in Bulk Material A8-1 a contact angle of 19.2° is presented, and a contact angle of 21.4° is presented when the surfactant FS-2000 is included in Bulk Material A8-1. A contact angle of 26.5° is presented when surfactant FC-4432 is included in Bulk Material A8-1.

It should be understood that similar benefits of preferential adhesion and release with desirable wettability characteristics may be achieved by varying the surfactant composition on mold 36 or in the bulk material or both. For example, increasing the surfactant concentration in bulk material A8-1 to 0.7% of the composition by weight with 0.2% comprising Tergitol NP-10 and 0.5% being FS-2000 presented the second best wetting characteristics evidenced by a contact angle of approximately 17.4%. It should be noted that for this measurement, about 0.012% of the IPA mixture, mentioned above, consisted of the surfactant mixture FS-2000 and Tergitol NP-10, instead of 0.01% of the solution. In this example, a surfactant mixture is employed in which fluorine-containing and non-fluorine-containing surfactants are employed. Tergitol NP-10 is a hydrocarbon surfactant that has a faster dynamic speed than fluorinated surfactants, such as FS-2000.

Additionally, the surfactant composition may be modified by employing a differing surfactant in layer 70 than is included in the imprinting material that is contacted by the mold. For example, Bulk Material A7-2

| | Surfactant | | | | | |
|---|---|---|---|---|---|---|
| | FC-4430 | FC-4432 | FC-4430 | R-08 | FC-4430 & FC-4432 | R-08 & FC-4430 |
| Contact Angle | 43.2° | 26° | 18.1° | 20.0° | 22° | 14.7° |

Bulk material A7-2 includes all of the constituent components of material A7-1 and includes a surfactant FSO-100. In Bulk Material A7-2, approximately 46.875% of the composition by weight is IBOA, 24.875% of the composition by weight is nHA, 24.875% of the composition by weight is EGDA, 2.875% of the composition by weight is Darocur 1173; and approximately 0.5% of which is FSO-100. Specifically, surface 58 coated with the IPA mixture including FSO-100, the least desirable wettability characteristics are provided, with the contact angle being the greatest at 43.2°. With surface 58 coated with the combination surfactant R-08 and FC-4430, each of which comprises 0.5% of the IPA mixture, that contact angle presented is 14.7%. For the remaining measurements, a contact angle of approximately 18.1° is presented when surface 58 is coated with the FC-4430 surfactant, and a contact angle of approximately 20° is present when surface 58 is coated with the R-08 surfactant. When surface 58 is coated with a combination surfactant including FC-4430 and FC-4432 is deposited in layer 70, a contact angle of approximately 22° is presented. FC-4430 comprises 0.333% of the IPA mixture and FC-4432 comprises 0.167% of the IPA mixture, by weight. When surface 58 is coated with FC-4432, absent any other surfactant, a contact angle of approximately 26.0° is presented. As can be seen, therefore, by properly selecting the surfactant component in each of the bulk materials, the desired wetting characteristics may be obtained, along with the desired preferential adhesion and release characteristics.

The embodiments of the present invention described above are exemplary. Many changes and modifications may be made to the disclosure recited above, while remaining within the scope of the invention. The scope of the invention should, therefore, be determined not with reference to the above description, but instead should be determined with reference to the appended claims along with their full scope of equivalents.

What is claimed is:

1. A composition defining an air-liquid interface, said composition comprising:
   a polymerizable bulk material; and
   a surfactant having opposed ends, one of which has an affinity for said bulk material and the remaining end having a fluorine component, said surfactant having the following formula:

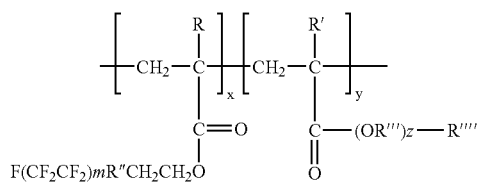

wherein R and R' are identical or different and selected from the group consisting of H and methyl; wherein R" is an optional sulfonyl linking group —SO$_2$N(R""), with R"" selected from the group consisting of C$_1$ to C$_6$ alkyl; wherein (OR''')$_z$ is a poly(oxyalkylene) group comprising at least one type of oxyalkylene unit; wherein R'''' is a terminal group selected from the group consisting of H, methyl, and C$_1$ to C$_4$ alkyl; and wherein the ratio of x to y is in a range of 1:2 to 3:1.

2. The composition as recited in claim 1 wherein said fluorine component extends from said air-liquid interface.

3. The composition as recited in claim 1 further comprising an additional surfactant is selected from the group consisting of ionic, non-ionic, cationic and zwitterionic surfactants.

4. The composition as recited in claim 1 further comprising an additional surfactant having the following formula:

where (R'''''O)$_{Y'}$ is a poly(oxyalkylene) group, that includes groups having two to four-carbon atoms R''''' is a terminal group of H or C$_1$ to C$_4$ alkyl, and X' and Y' are integers.

5. The composition as recited in claim 1 further comprising an additional surfactant component having the following structure:

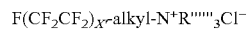

where X' is an integer in a range of 1 to 7, inclusive.

6. The composition as recited in claim 1 further comprising an additional surfactant having the following structure:

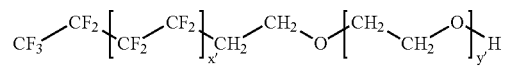

where x' is an integer in a range of 0 to 6, inclusive; and y' is an integer in a range of 0 to 15, inclusive.

7. The composition as recited in claim 1 further comprising an additional surfactant having the following structure:

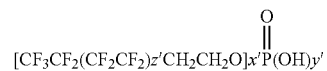

where x' is an integer having a value of 1 to 2; y' is an integer having a value of 2 to 1; z' is an integer having a value in a range of 0 to 6, inclusive.

8. The composition as recited in claim 1 further comprising an additional surfactant, wherein said additional surfactant comprises fluorine and silicon atoms.

9. The composition as recited in claim 1 further comprising an additional surfactant, with said additional surfactant being selected from the group consisting of a silicon-based surfactant, a hydrocarbon-based surfactant, and a fluorinated surfactant.

10. A composition defining an air-liquid interface, said composition comprising:
    a bulk material including an initiator component and compounds selected from a set of compounds consisting of vinyl ethers, methacrylates, acrylates, thiolenes, epoxies; and
    a surfactant having opposed ends, one of which has an affinity for said bulk material and the remaining end having a fluorine component, said surfactant having the following formula:

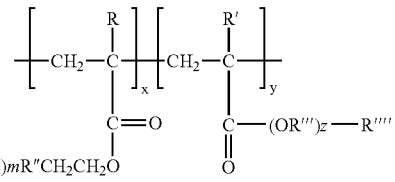

wherein R and R' are identical or different and selected from the group consisting of H and methyl; wherein R" is an optional sulfonyl linking group —SO$_2$N(R""), with R"" selected from the group consisting of C$_1$ to C$_6$ alkyl; wherein (OR''')$_y$ is a poly(oxyalkylene) group comprising at least one type of oxyalkylene unit; wherein R'''' is a terminal group selected from the group consisting of H, methyl, and $C_1$ to $C_4$ alkyl; and wherein the ratio of x to y is in a range of 1:2 to 3:1.

11. The composition as recited in claim 10 wherein said fluorine component extends from said air-liquid interface.

12. The composition as recited in claim 10 further comprising an additional surfactant selected from the group consisting of ionic, non-ionic, cationic and zwitterionic surfactants.

13. The composition as recited in claim 10 further comprising an additional surfactant having the following formula:

where $(R''''O)_{Y'}$ is a poly(oxyalkylene) group, that includes groups having two to four carbon atoms $R''''$ is a terminal group of H or $C_1$ to $C_4$ alkyl, and X' and Y' are integers.

14. The composition as recited in claim 10 further comprising an additional surfactant having the following structure:

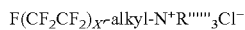

where X' is an integer in a range of 1 to 7, inclusive.

15. The composition as recited in claim 10 further comprising an additional surfactant having the following structure:

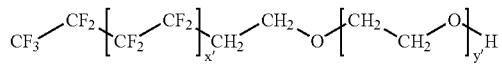

where x' is an integer in a range of 0 to 6, inclusive; and y' is an integer in a range of 0 to 15, inclusive.

16. The composition as recited in claim 10 further comprising an additional surfactant having the following structure:

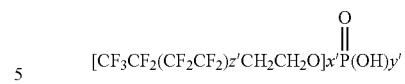

where x' is an integer having a value of 1 to 2; y' is an integer having a value of 2 to 1; z' is an integer having a value in a range of 0 to 6, inclusive.

17. The composition as recited in claim 10 further comprising an additional surfactant, wherein said additional surfactant comprises fluorine and silicon atoms.

18. The composition as recited in claim 10 further comprising an additional surfactant with said additional surfactant being selected from the group consisting of a siloxane-based surfactant, a hydrocarbon-based surfactant and a fluorinated surfactant.

19. The composition as recited in claim 1, wherein the ratio of x to y is in a range of 1:1 to 2:1.

20. The composition of claim 4, wherein $R''''$ is selected from the group consisting of —$CH_2CH_2$—, —$CH_2CH_2CH_2$—, $CH(CH_3)CH_2$—, and —$CH(CH_3)CH(CH_3)$—.

21. The composition of claim 4, wherein $R''''$ is a terminal group selected from the group consisting of H and methyl.

22. The compositions recited in claim 10, wherein the ratio of x to y is in a range of 1:1 to 2:1.

23. The composition of claim 13, wherein $R''''$ is selected from the group consisting of —$CH_2CH_2$—, —$CH_2CH_2CH_2$—, $CH(CH_3)CH_2$—, and —$CH(CH_3)CH(CH_3)$—.

24. The composition of claim 13, wherein $R''''$ is a terminal group selected from the group consisting of H and methyl.

* * * * *